US012797910B2

(12) United States Patent
Kim

(10) Patent No.: US 12,797,910 B2
(45) Date of Patent: Nov. 17, 2026

(54) WAFER CLEANING DEVICE AND WAFER POLISHING EQUIPMENT

(71) Applicant: SAMSUNG ELECTRONICS CO., LTD., Suwon-si (KR)

(72) Inventor: Sanghyeok Kim, Suwon-si (KR)

(73) Assignee: SAMSUNG ELECTRONICS CO., LTD., Suwon (KR)

( * ) Notice: Subject to any disclaimer, the term of this patent is extended or adjusted under 35 U.S.C. 154(b) by 53 days.

(21) Appl. No.: 18/827,062

(22) Filed: Sep. 6, 2024

(65) Prior Publication Data

US 2025/0312828 A1 Oct. 9, 2025

(30) Foreign Application Priority Data

Apr. 4, 2024 (KR) ........................ 10-2024-0046242

(51) Int. Cl.

| | |
|---|---|
| ***B08B 1/34*** | (2024.01) |
| ***B08B 1/12*** | (2024.01) |
| ***B08B 1/54*** | (2024.01) |
| ***H10P 70/00*** | (2026.01) |
| ***H10P 72/00*** | (2026.01) |

(52) U.S. Cl.

CPC .................. *B08B 1/34* (2024.01); *B08B 1/12* (2024.01); *B08B 1/54* (2024.01); *H10P 70/12* (2026.01); *H10P 70/60* (2026.01); *H10P 72/0428* (2026.01)

(58) Field of Classification Search

None

See application file for complete search history.

(56) References Cited

U.S. PATENT DOCUMENTS

| | | | |
|---|---|---|---|
| 5,639,311 A | 6/1997 | Holley et al. | |
| 6,438,781 B1 * | 8/2002 | Ritchey, Jr. | H10P 72/0412 134/140 |
| 10,269,555 B2 * | 4/2019 | Huang | B08B 1/12 |
| 2002/0139393 A1 | 10/2002 | Crevasse et al. | |
| 2013/0111678 A1 | 5/2013 | Chen et al. | |
| 2015/0096591 A1 | 4/2015 | Zhang | |
| 2017/0110317 A1 | 4/2017 | Zhang | |
| 2019/0006204 A1 * | 1/2019 | Wei | H10P 72/0412 |
| 2020/0203152 A1 | 6/2020 | Park et al. | |

FOREIGN PATENT DOCUMENTS

| | | |
|---|---|---|
| JP | 2003-529929 A | 10/2003 |
| KR | 10-2017-0079736 A | 7/2017 |

* cited by examiner

*Primary Examiner* — Shay Karls

(74) *Attorney, Agent, or Firm* — Sughrue Mion, PLLC

(57) ABSTRACT

A wafer cleaning device includes: a first brush assembly on a first side of a wafer and comprising a plurality of brushes configured to clean a first surface of the wafer; a first brush cleaner configured to clean the plurality of brushes of the first brush assembly; a brush mover including at least one actuator, the brush mover connected to the plurality of brushes of the first brush assembly and configured to move positions of the plurality of brushes; and a brush rotator including at least one actuator, the brush rotator connected to the plurality of brushes of the first brush assembly and configured to rotate each of the plurality of brushes.

15 Claims, 20 Drawing Sheets

WAFER CLEANING DEVICE AND WAFER POLISHING EQUIPMENT

CROSS-REFERENCE TO RELATED APPLICATION

This application claims priority to Korean Patent Application No. 10-2024-0046242, filed in the Korean Intellectual Property Office on Apr. 4, 2024, the entire contents of which are hereby incorporated by reference.

BACKGROUND

1. Field

Embodiments of the present disclosure relate to a wafer cleaning device, wafer polishing equipment, and a method for cleaning a wafer.

2. Description of Related Art

Numerous processes are performed to form a desired pattern on a semiconductor wafer. During the process, unnecessary thin films may be formed or various contaminants may remain on the wafer surface. In particular, when a polishing process (e.g., a planarization process) is performed on a semiconductor wafer using chemical mechanical polishing (CMP) equipment, polishing debris such as colloidal abrasives included in a polishing slurry may remain on the wafer. Therefore, after the polishing process is completed and before a subsequent process starts, a cleaning process needs to be performed to remove polishing debris from the wafer surface.

Accordingly, a cleaning process of cleaning the wafer while rotating the wafer and/or a brush in contact with the wafer may be performed. As the cleaning process continues, the polishing debris may be transferred to the brush, contaminating the brush, in which case the polishing debris attached to the brush may be transferred back to the wafer, and the wafer can be contaminated again. In addition, organic particles in the polishing debris may not be easily removed even if the cleaning process is performed.

SUMMARY

In order to solve one or more problems (e.g., the problems described above and/or other problems not explicitly described herein), embodiments of the present disclosure provide a wafer cleaning device, wafer polishing equipment, and a method for cleaning a wafer.

According to embodiments of the present disclosure, a wafer cleaning device is provided and includes: a first brush assembly on a first side of a wafer and including a plurality of brushes configured to clean a first surface of the wafer; a first brush cleaner configured to clean the plurality of brushes of the first brush assembly; a brush mover including at least one actuator, the brush mover connected to the plurality of brushes of the first brush assembly and configured to move positions of the plurality of brushes; and a brush rotator including at least one actuator, the brush rotator connected to the plurality of brushes of the first brush assembly and configured to rotate each of the plurality of brushes.

According to embodiments of the present disclosure, wafer polishing equipment is provided and includes: a polisher configured to polish a first surface of a wafer; and a wafer cleaner configured to clean the wafer polished by the polisher, wherein the wafer cleaner includes: a brush assembly on a first side of the wafer and including a plurality of brushes configured to clean the first surface of the wafer; a brush cleaner configured to clean the plurality of brushes of the brush assembly; a brush mover including at least one actuator, the brush mover connected to the plurality of brushes of the brush assembly and configured to move positions of the plurality of brushes; and a brush rotator including at least one actuator, the brush rotator connected to the plurality of brushes of the brush assembly and configured to rotate each of the plurality of brushes.

According to embodiments of the present disclosure, a method performed by a wafer cleaning device that includes a brush rotator, including at least one actuator, and a brush mover, including at least one actuator, is provided. The method includes: cleaning a first wafer in a wafer position by rotating, by the brush rotator at a first time, a first brush in a wafer cleaning position adjacent to the wafer position; cleaning one or more additional brushes by rotating, by the brush rotator at the first time, each of the one or more additional brushes in a brush cleaning position adjacent to one or more brush cleaners; moving, by the brush mover at a second time after the first time, the first brush in the wafer cleaning position to the brush cleaning position; and moving, by the brush mover at the second time, a second brush of the one or more additional brushes in the brush cleaning position to the wafer cleaning position; cleaning the first wafer or a second wafer in the wafer position by rotating, by the brush rotator at a third time after the second time, the second brush in the wafer cleaning position; and cleaning the first brush by rotating, by the brush rotator at the third time, the first brush in the brush cleaning position.

According to embodiments of the present disclosure, a plurality of brushes are movably arranged in one module and, accordingly, it is possible to repeatedly clean one wafer without transferring the wafer within the module, and the wafer can be effectively cleaned. In particular, it is possible to effectively remove organic particles that are difficult to remove with a single cleaning.

According to embodiments of the present disclosure, a plurality of brushes are alternately used to clean one wafer, and a brush that is not cleaning the wafer is cleaned through the brush cleaner. Accordingly, the cleaned brush cleans the wafer in its turn, and the possibility the wafer is contaminated again through the brush can be minimized or prevented. Furthermore, since contamination of the brush is minimized or prevented, the service life of the brush can be extended.

Effects of embodiments of the present disclosure are not limited to the effects described above, and other effects not described herein can be clearly understood by those of ordinary skill in the art from the following description.

BRIEF DESCRIPTION OF DRAWINGS

The above and other aspects, features, and advantages of embodiments of the present disclosure will be described with reference to the accompanying drawings described below, where similar reference numerals indicate similar elements, but not limited thereto, in which.

DETAILED DESCRIPTION

Figure 1:
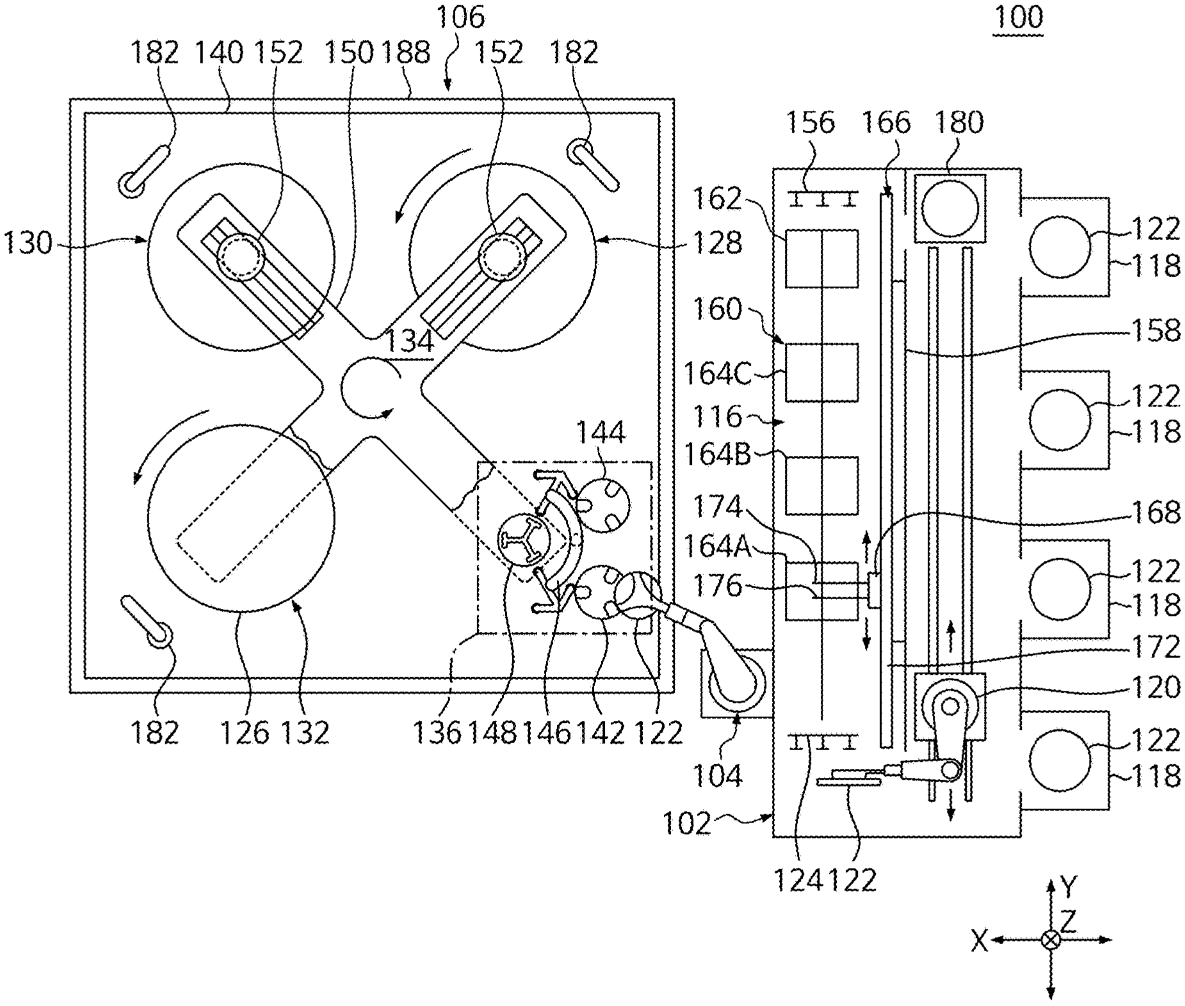
FIG. 1 is a diagram illustrating an example of wafer polishing equipment.

Hereinafter, non-limiting example embodiments of the present disclosure will be described in detail with reference to the accompanying drawings. However, in the following description, detailed descriptions of well-known functions or configurations may be omitted if it may make the subject matter of the present disclosure unclear.

In the accompanying drawings, the same or corresponding components are assigned the same reference numerals. In addition, in the following description of various examples, duplicate descriptions of the same or corresponding components may be omitted. However, even if descriptions of components are omitted, it is not intended that such components are not included in any example.

Advantages and features of embodiments of the present disclosure will be apparent by referring to example embodiments described below in connection with the accompanying drawings. However, embodiments of the present disclosure are not limited to the example embodiments describe below, and may be implemented in various forms different from each other. The example embodiments are merely provided to make the present disclosure complete, and to fully disclose the scope of the present disclosure to those skilled in the art to which the present disclosure pertains.

The terms used herein may be briefly described prior to describing example embodiments in detail. The terms used herein have been selected as general terms which are widely used at present in consideration of the functions of embodiments of the present disclosure, and this may be altered according to the intent of a person of skill in the art, related practice, or introduction of new technology. In addition, in specific cases, certain terms may be arbitrarily selected by the applicant, and the meaning of the terms will be described in detail in a corresponding description of an example embodiment(s). Therefore, the terms used in the present disclosure should be defined based on the meaning of the terms and the overall content of the present disclosure rather than a simple name of each of the terms.

In the present disclosure, the singular forms "a," "an," and "the" are intended to include the plural forms as well, unless the context clearly indicates the singular forms. Further, the plural forms are intended to include the singular forms as well, unless the context clearly indicates the plural forms. As used throughout the description, if any part is referred to as "comprising" (or "including" or "having") any element, it is intended as meaning that the part may additionally include another element, rather than excluding the same, unless specifically described otherwise.

In the present disclosure, the term "and/or" includes a combination of a plurality of listed items or any one of a plurality of listed items. The statement "A and/or B" as used herein means "A," or "B," or "A and B."

In the present disclosure, the upper direction of the configuration illustrated in the drawings may be referred to as "upper portion" or "upper side," and the lower direction may be referred to as "lower portion" or "lower side." In addition, in the drawings, a portion between the upper and lower portions of the configuration illustrated in the drawings, or a portion other than the upper and lower portions may be referred to as "side portion" or "side." These relative terms such as "upper portion" and "upper side" may be used to describe the relationship between elements illustrated in the drawings, and the present disclosure is not limited by these terms.

In this disclosure, it should be understood that when any element is referred to as being "fastened," "coupled," or "connected" to another element, the element may be directly coupled or connected to another element, or there may be yet another element therebetween. On the other hand, in the description, when any element is referred to as being "directly fastened," "directly coupled," or "directly connected" to another element, it should be understood that there are no other elements therebetween.

Figure 2:
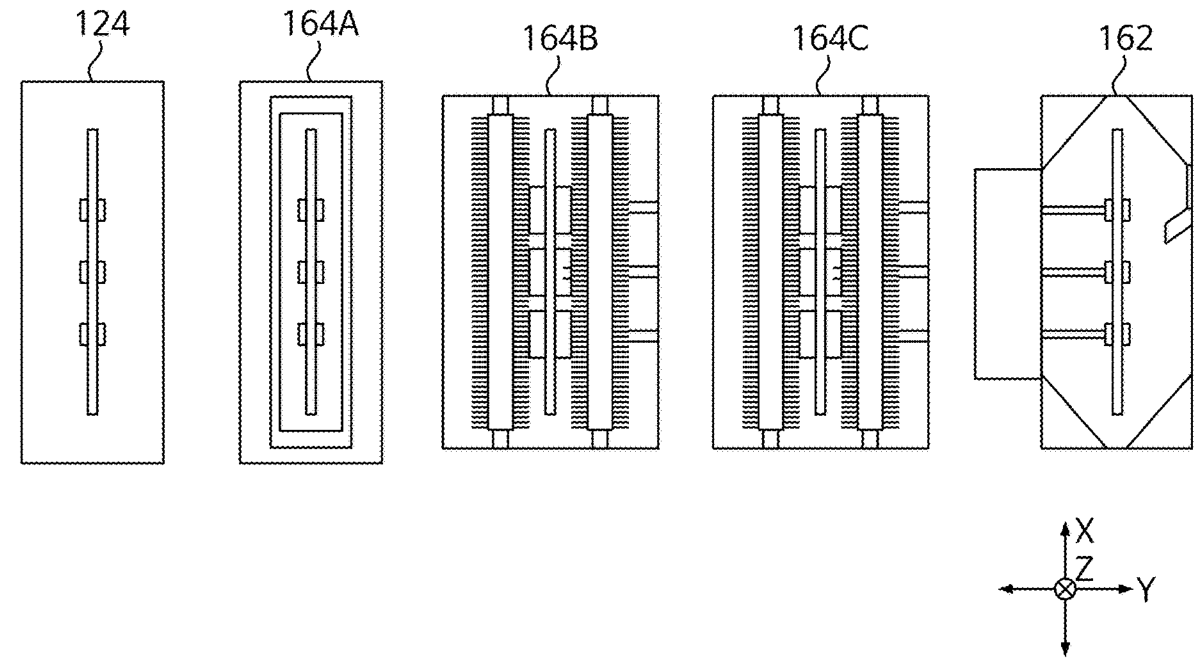
FIG. 2 is a diagram illustrating an example of a part of a cleaner included in the wafer polishing equipment of FIG. 1.

FIG. 1 is a diagram illustrating an example of wafer polishing equipment 100, and FIG. 2 is a diagram illustrating an example of a part of a cleaner 116 included in the wafer polishing equipment 100 of FIG. 1.

Referring to FIG. 1, the wafer polishing equipment 100 may include a factory interface 102, a loading robot 104, and a polishing module 106 (e.g., a polisher). The loading robot 104 is disposed between the factory interface 102 and the polishing module 106 to transfer a wafer 122 therebetween.

The factory interface 102 may include the cleaner 116, one or more cassettes 118, and an interface robot 120. The interface robot 120 may transfer the wafer 122 between the cassette 118 and the cleaner 116 (specifically, an input module 124). For example, the interface robot 120 may transfer the wafer 122 from one of the one or more cassettes 118 to the input module 124. The loading robot 104 may transfer the wafer 122 disposed in the input module 124 to the polishing module 106.

The polishing module 106 may include one or more chemical mechanical polishing stations (e.g., a first chemical polishing station 128, a second chemical polishing station 130, and a third chemical polishing station 132). For example, the polishing module 106 may include one or more chemical mechanical polishing stations (e.g., a first chemical polishing station 128, a second chemical polishing station 130, and a third chemical polishing station 132) disposed inside an environmentally controlled enclosure 188.

As a specific example, the polishing module 106 may include a first chemical mechanical polishing station 128, a second chemical mechanical polishing station 130, and a third chemical mechanical polishing station 132, as illustrated in FIG. 1. The first chemical mechanical polishing station 128 may perform a chemical mechanical planarization process for the bulk removal of a conductive material from the wafer 122. The second chemical mechanical polishing station 130 may perform an additional chemical mechanical planarization process to remove a residual conductive material from the wafer 122 after the bulk removal in the first chemical mechanical polishing station 128. In addition, the third chemical mechanical polishing station 132 may perform an additional chemical mechanical planarization process to perform an additional planarization process on the wafer 122 after the removal of a residual conductive material in the second chemical mechanical polishing station 128.

The polishing module 106 may further include, disposed on a machine base 140, a carousel 134, a transfer station 136, and adjustment devices 182.

The carousel 134 may be disposed centrally on the machine base 140. The carousel 134 may include a plurality of arms 150, and each of the plurality of arms 150 may support a planarizing head assembly 152. In FIG. 1, illustration of two of the plurality of arms 150 is omitted to better illustrate a planarizing surface 126 of the third chemical mechanical polishing station 132 and the transfer station 136. The carousel 134 may be implemented to be indexable such that the planarizing head assembly 152 can be moved between the chemical mechanical polishing stations (e.g., the first chemical polishing station 128, the second chemical polishing station 130, and the third chemical polishing station 132) and the transfer station 136.

The transfer station 136 may include an input buffer station 144, an output buffer station 142, a transfer robot 146, and a load cup assembly 148. The wafers 122 may be transferred by the loading robot 104 from the factory interface 102 to the input buffer station 144 to be polished in the polishing module 106. In addition, the wafers 122 with at least one surface polished in the polishing module 106 may be transferred from the output buffer station 142 to the factory interface 102 by the loading robot 104.

The transfer robot 146 may be used to transfer the wafers 122 between the buffer stations (e.g., the output buffer station 142 and the input buffer station 144) and the load cup assembly 148. To this end, the transfer robot 146 may include a gripper assembly. For example, the transfer robot 146 may include two gripper assemblies as illustrated in FIG. 1. In addition, each gripper assembly may include a pneumatic gripper finger that holds the wafer 122. While transferring the wafer 122, that is polished, from the load cup assembly 148 to the output buffer station 142, the transfer robot 146 may transfer the wafers 122 to be polished from the input buffer station 144 to the load cup assembly 148.

The adjustment devices 182 may be disposed on the machine base 140, close to each of the chemical mechanical polishing stations (e.g., the first chemical polishing station 128, the second chemical polishing station 130, and the third chemical polishing station 132). The adjustment devices 182 may periodically adjust the planarization material provided to the chemical mechanical polishing stations (e.g., the first chemical polishing station 128, the second chemical polishing station 130, and the third chemical polishing station 132), thereby keeping the planarization result uniform.

Referring to FIGS. 1 and 2, the cleaner 116 included in the factory interface 102 may remove polishing debris that may remain after polishing, polishing fluid flowing from the wafer 122 that is polished, etc. The cleaner 116 may include the input module 124, a plurality of cleaning modules 160, a drying module 162, a wafer handling module 166, and an output module 156. The input module 124 may serve as a transfer station between the factory interface 102, the cleaner 116, and the polishing module 106. The output module 156 may receive the wafer 122 that has passed and been cleaned through the plurality of cleaning modules 160.

Each of the plurality of cleaning modules 160 may clean the surface of the wafer 122. While the cleaning process is performed, the wafer 122 may be passed through the plurality of cleaning modules 160, while being moved by the wafer handling module 166 disposed at a side of the plurality of cleaning modules 160. The plurality of cleaning modules 160 may include a megasonic module 164A, a first brush module 164B, a second brush module 164C, and the drying module 162. The number, type, order, etc., of the cleaning modules 160 illustrated in FIGS. 1 and 2 are merely an example, and the scope of the present disclosure is not limited thereto. At least some of the illustrated cleaning modules may be omitted, the order thereof may be changed, or cleaning modules may be added.

According to embodiments, the megasonic module 164A may be provided with the wafer 122, washed with deionized water immediately after polishing is completed, and remove large-sized particles using cavitation by megasonic.

The first brush module 164B may primarily remove contamination by performing primary scrubbing on the wafer 122 with a brush. The second brush module 164C may perform secondary scrubbing on the wafer 122 with a brush to secondarily remove contamination. The wafer 122 completely removed of the contamination by the second brush module 164C may be transmitted to the drying module 162 by the wafer handling module 166.

The drying module 162 may receive the wafer 122 cleaned at the plurality of cleaning modules 160 to dry the wafer 122. The drying module 162 may dry the wafer 122 using deionized water and ISO propyl alcohol (IPA). The wafer 122 dried by the drying module 162 may be transferred to the output module 156.

The wafer handling module 166 may include a transfer unit 168 and a rail 172. The transfer unit 168 may be moved along the rail 172 and transfer the wafer 122 to the input module 124, the megasonic module 164A, the first brush module 164B, the second brush module 164C, and/or the drying module 162. The transfer unit 168 may include grippers 174 and 176 for inserting or removing the wafer 122 to or from at least one from among the input module 124, the megasonic module 164A, the first brush module 164B, the second brush module 164C, and the drying module 162. In addition, the rail 172 may be coupled to a partition 158 for separating the cassettes 118 and the interface robot 120 from the cleaner 116.

According to embodiments of the present disclosure, the wafer handling module 166 may include at least one actuator configured to cause the transfer unit 168 to move.

After drying is completed, the wafer 122 transferred to the output module 156 may be returned to one of the cassettes 118 by the interface robot 120. The factory interface 102 may further include a measurement device 180 for testing the cleaner 116. For example, the measurement device 180 may include an optical measuring device (e.g., an optical sensor). Optionally, the wafers 122 may be transferred to the measurement device 180 by the interface robot 120 or the wafer handling module 166 before being returned to the cassette 118. The wafers 122 may be tested in the measurement device 180.

In the following description of the present disclosure, description of a "wafer cleaning device" or a "cleaning module" may be applied to at least one from among the first brush module 164B and the second brush module 164C illustrated in FIGS. 1 and 2.

Figure 3:
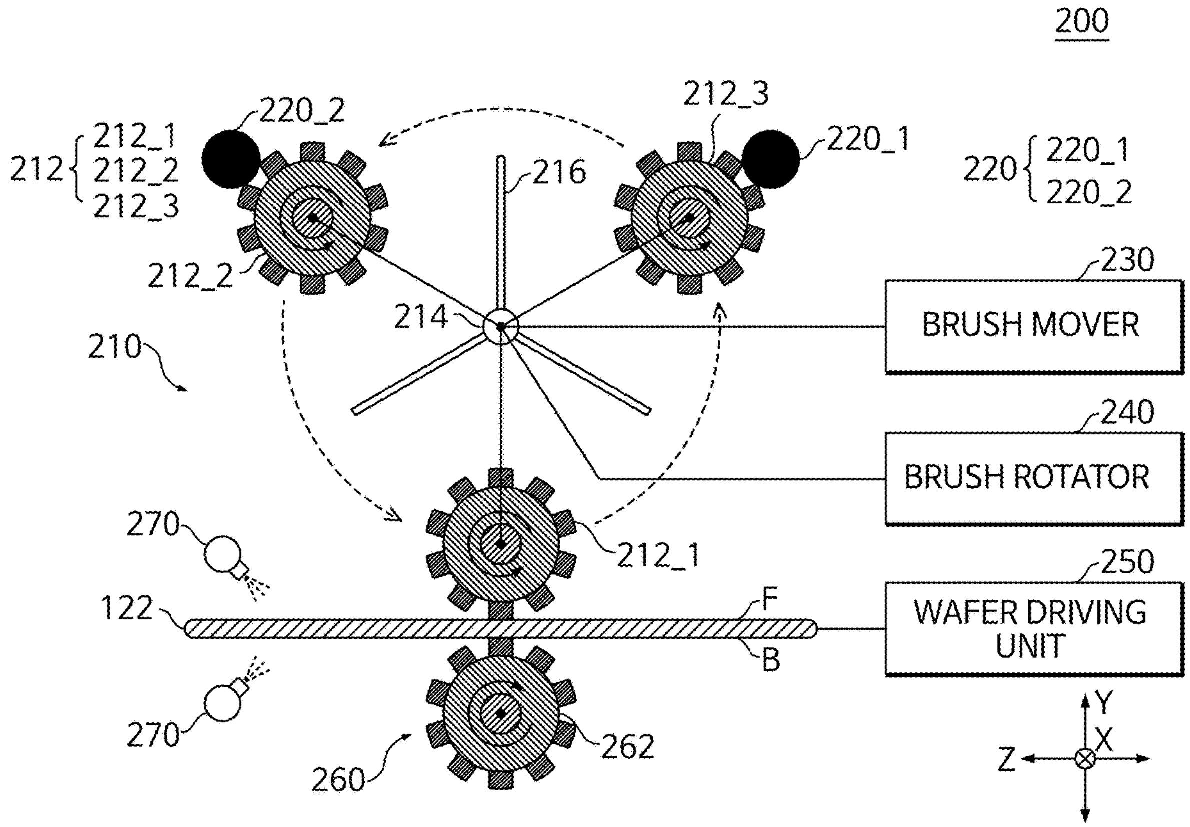
FIG. 3 is a diagram illustrating an example of a wafer cleaning device.
Figure 4:
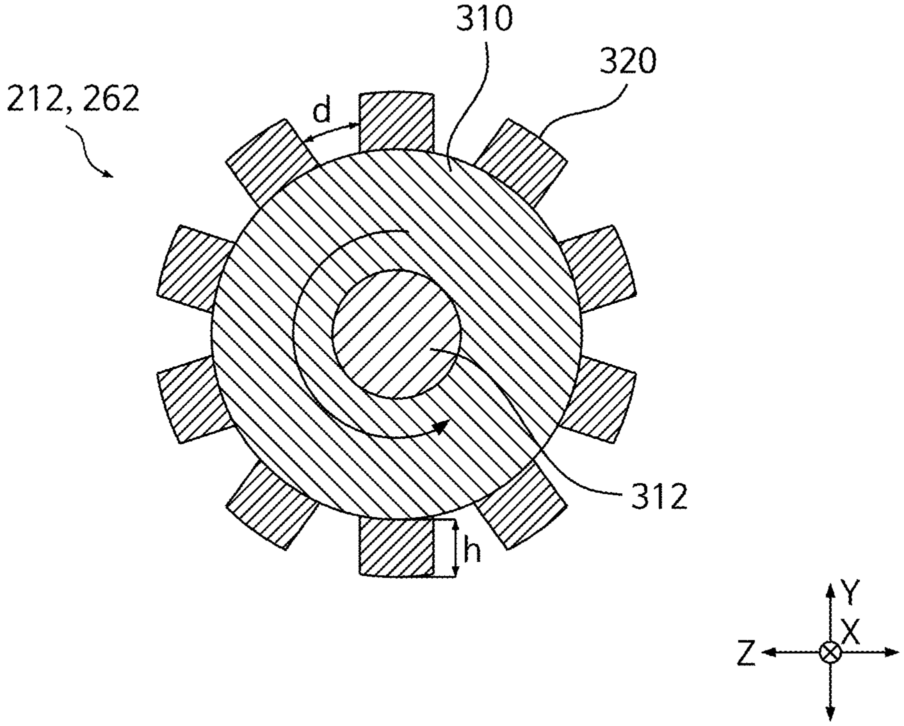
FIG. 4 is a diagram illustrating an example of brushes and included in the wafer cleaning device.

FIG. 3 is a diagram illustrating an example of a wafer cleaning device 200, and FIG. 4 is a diagram illustrating an example of brushes 212 and 262 included in the wafer cleaning device 200.

Referring to FIG. 3, after the polishing process (e.g., CMP process) on the wafer 122 is performed, the wafer 122 may be cleaned by the wafer cleaning device 200. The wafer cleaning device 200 may include a first brush assembly 210, one or more brush cleaners 220, a brush mover 230, and a brush rotator 240. In some aspects, the wafer cleaning device 200 may be referred to as a wafer cleaner.

The first brush assembly 210 may be disposed on a first surface F (or the first surface F side) of the wafer 122 (or on a wafer position at which the wafer 122 is disposed). The first surface F may be a surface polished in the polishing process. For example, the first surface F may be a front surface of the wafer 122, which is polished in the polishing process.

The first brush assembly 210 may include a plurality of brushes (e.g., a first brush 212_1, a second brush 212_2, and a third brush 212_3) for cleaning the first surface F of the wafer 122. The plurality of brushes included in the first brush assembly 210 may be placed in one of a wafer cleaning position near (e.g., adjacent to) the wafer 122 (or near the wafer position) or a brush cleaning position near the brush cleaner, respectively. The brush 212 placed in the wafer cleaning position may clean the wafer 122 (e.g., the first surface F of the wafer 122). While the brush 212 placed in the wafer cleaning position is cleaning the wafer 122, the brush 212 placed in the brush cleaning position may be cleaned by the brush cleaner 220 placed near the brush cleaning position.

For example, as illustrated in FIG. 3, the first brush assembly 210 may include a first brush 212_1, a second brush 212_2, and a third brush 212_3. In addition, the brush cleaner 220 may include a first brush cleaner 220_1 and a second brush cleaner 220_2. In this example, as illustrated in FIG. 3, the first brush 212_1 may be placed in the wafer cleaning position near the first surface F of the wafer 122, and the third brush 212_3 and the second brush 212_2 may be placed in a first brush cleaning position near the first brush cleaner 220_1 and a second brush cleaning position near the second brush cleaner 220_2, respectively. The first brush 212_1 placed in the wafer cleaning position may clean the wafer 122 placed in the wafer position. While the wafer 122 is being cleaned by the first brush 212_1, the third brush 212_3 may be cleaned by the first brush cleaner 220_1, and the second brush 212_2 may be cleaned by the second brush cleaner 220_2.

The brush cleaner 220 may clean the brush 212 included in the first brush assembly 210. For example, the brush cleaner 220 may clean the brush 212 by removing the polishing debris, polishing fluid, etc., from the brush 212 that has cleaned the wafer 122. The brush cleaner 220 may be in contact with the brush 212 placed in the brush cleaning position near the brush cleaner 220 to physically clean the brush 212. For example, the brush cleaner 220 may be a rod made of quartz ($SiO_2$) material. Additionally or alternatively, the brush cleaner 220 may inject the cleaning liquid onto the brush 212 placed in the brush cleaning position near the brush cleaner 220 to physically and chemically clean the brush 212. For example, the brush cleaner 220 may inject a cleaning liquid containing deionized water and/or organic matter to the brush 212 placed in the brush cleaning position near the brush cleaner 220 to physically and chemically clean the brush 212.

The brush cleaner 220 may include a plurality of brush cleaners (e.g., the first brush cleaner 220_1 and the second brush cleaner 220_2). For example, the plurality of brush cleaners (e.g., the first brush cleaner 220_1 and the second brush cleaner 220_2) may be the same type of brush cleaners. Alternatively, at least two of the plurality of brush cleaners (e.g., the first brush cleaner 220_1 and the second brush cleaner 220_2) may be different types of brush cleaners.

The first brush assembly 210 may further include a central axis 214 and one or more blocking walls 216. For example, the central axis 214 may be disposed among the plurality of brushes (e.g., the first brush 212_1, the second brush 212_2, and the third brush 212_3) included in the first brush assembly 210, and may have an elongated form that extends in one direction. For example, the central axis 214 may have an elongated shape that extends in the same direction (e.g., in X-axis direction of FIG. 3) as rotation axes of the plurality of brushes (e.g., the first brush 212_1, the second brush 212_2, and the third brush 212_3) included in the first brush assembly 210.

The blocking walls 216 may be disposed between adjacent ones of the brushes 212 of the first brush assembly 210. The blocking walls 216 may be formed to extend from the central axis 214 to between the adjacent ones of the brushes 212. Each of the blocking walls 216 may block between the brushes 212 such that cleaning liquid, polishing fluid, and/or polishing debris, etc., falling from the brush cleaning position are not transferred to the wafer 122 and/or other brushes 212. Additionally or alternatively, the blocking walls 216 may each block between the brushes 212 such that cleaning liquid, polishing fluid, and/or polishing debris, etc., falling from the wafer cleaning position are not transferred to the brush 212 placed in the brush cleaning position.

The brush mover 230 may be connected to the plurality of brushes 212 included in the first brush assembly 210 and may move the positions of the plurality of brushes 212. The brush mover 230 may move the plurality of brushes 212 included in the first brush assembly 210 to the wafer cleaning position near the first surface F of the wafer 122 or the brush cleaning position near the brush cleaner 220. For example, the brush mover 230 may move a brush (e.g., the first brush 212_1 in FIG. 3) of the plurality of brushes (e.g., the first brush 212_1, the second brush 212_2, and the third brush 212_3) that is placed in the wafer cleaning position to the brush cleaning position, and may move at least one of the brushes (e.g., the second brush 212_2 and the third brush 212_3 in FIG. 3) that is placed in the brush cleaning position to the wafer cleaning position. The brush mover 230 may move the plurality of brushes 212 included in the first brush assembly 210 to another positions by moving the plurality of brushes 212 in a first direction (e.g., in a counterclockwise direction) or a second direction (e.g., in a clockwise direction) in rotation around a first axis (e.g., the central axis 214 or a virtual first axis in the X-axis direction).

As a specific example, as illustrated in FIG. 3, the first brush 212_1 may be placed in the wafer cleaning position near the first surface F of the wafer 122, and the third brush 212_3 and the second brush 212_2 may be placed in the first brush cleaning position near the first brush cleaner 220_1 and the second brush cleaning position near the second brush cleaner 220_2, respectively. In this state, the brush mover 230 may move the plurality of brushes 212 in the counterclockwise direction in rotation around the first axis (e.g., the central axis 214), so that the first brush 212_1 may be moved to the first brush cleaning position, the second brush 212_2 may be moved to the wafer cleaning position, and the third brush 212_3 may be moved to the second brush cleaning position. Accordingly, the cleaned brush (e.g., the second brush 212_2) may be moved to the wafer cleaning position to clean the wafer 122, and the brush (e.g., the first brush 212_1) that cleaned the wafer 122 may be moved to the brush cleaning position and cleaned by the brush cleaner 220.

The brush mover 230 may change the direction of rotational movement each time the brush mover 230 moves the plurality of brushes 212. This will be described in more detail below with reference to FIGS. 15 to 17.

The brush mover 230 may individually move each of the plurality of brushes 212 such that each of the plurality of brushes 212 is moved close to or away from the first axis (e.g., the central axis 214). Accordingly, the degree of contact between the brush 212 placed in the wafer cleaning position and the wafer 122, and/or the degree of contact between the brush 212 placed in the brush cleaning position and the brush cleaner 220 may be individually adjusted. This will be described in more detail below with reference to FIGS. 5 to 8.

Additionally or alternatively, in order to adjust the degree of contact between the brush 212 placed in the wafer cleaning position and the wafer 122, the brush mover 230 may move the plurality of brushes (e.g., the first brush 212_1, the second brush 212_2, and the third brush 212_3) such that the brush (e.g., the first brush 212_1) placed in the wafer cleaning position is moved close to or away from the wafer 122. This will be described in more detail below with reference to FIGS. 9 and 10.

The brush mover 230 may move the plurality of brushes 212 and the blocking wall 216 included in the first brush assembly 210 at the same time. For example, the brush mover 230 may move the plurality of brushes 212 and the blocking wall 216 in rotation around the first axis (e.g., the central axis 214) at the same time. Alternatively, the blocking walls 216 may be fixed and the brush mover 230 may move only the plurality of brushes 212.

According to embodiments of the present disclosure, the brush mover 230 may include at least one actuator configured to cause the brush mover 230 to perform its functions.

The brush rotator 240 may be connected to each of the plurality of brushes 212 included in the first brush assembly 210, and may individually rotate and/or move the plurality of brushes 212. Each of the plurality of brushes 212 may be rotated around a second axis (e.g., a virtual second axis in the X-axis direction or a brush core 312 of FIG. 4 to be described below) positioned inside each brush. The first axis and the second axis may be parallel to each other. The brush rotator 240 may rotate each of the plurality of brushes 212 in the same direction, or may rotate at least some of the plurality of brushes 212 in different directions.

The wafer cleaning device 200 may further include a wafer driving unit 250 to rotate the wafer 122. For example, the wafer driving unit 250 may rotate the wafer 122 around a third axis (e.g., a virtual third axis in the Y-axis direction) inside the wafer 122. For example, the wafer driving unit 250 may include a plurality of rollers arranged along a circumference of the wafer 122. As the plurality of rollers arranged along the circumference of the wafer 122 are rotated, the wafer 122 in contact with the roller may be rotated. The wafer 122 is rotated, and various areas of the wafer 122 may be brought into contact with the brush (e.g., the first brush 212_1) placed in the wafer cleaning position, resulting in better cleaning of the wafer 122.

According to embodiments of the present disclosure, the brush rotator 240 may include at least one actuator configured to cause the brush rotator 240 to perform its functions.

The wafer cleaning device 200 may further include a second brush assembly 260 disposed on a second surface B (or on the second surface B side) opposite to the first surface F (side) of the wafer 122 (or on the wafer position). The second brush assembly 260 may include one or more brushes 262.

For example, the second brush assembly 260 may include one brush 262 disposed on the second surface B (or on the second surface B side) of the wafer 122. The brush 262 included in the second brush assembly 260 may clean the second surface B of the wafer 122 and/or support the second surface B of the wafer 122 while the brush 212 included in the first brush assembly 210 is cleaning the first surface F of the wafer 122.

As another example, like the first brush assembly 210, the second brush assembly 260 disposed on the second surface B (or on the second surface B side) of the wafer 122 may also include a plurality of brushes. An example of the second brush assembly 260 including a plurality of brushes will be described elsewhere below in more detail with reference to FIG. 18.

The brush 262 included in the second brush assembly 260 may be connected to the brush rotator (e.g., the brush rotator 240 connected to the brushes 212 included in the first brush assembly 210 or a separate brush rotator). In this case, the brush 262 included in the second brush assembly 260 may be rotated by the brush rotator around the rotation axis (e.g., a virtual rotation axis in the X-axis direction or the brush core 312 of FIG. 4 to be described below) inside the brush 262.

The wafer cleaning device 200 may further include a cleaning liquid injection unit 270. The cleaning liquid injection unit 270 may inject a cleaning liquid toward the wafer 122 (e.g., toward the first surface F and/or the second surface B of the wafer 122). For example, the cleaning liquid injected by the cleaning liquid injection unit 270 may include deionized water (DI water), ammonia water ($NH_4OH$), and/or hydrofluoric acid (HF). The cleaning liquid injected by the cleaning liquid injection unit 270 may be a mixture of deionized water, ammonia water, and hydrofluoric acid, but is not limited thereto. With the cleaning liquid injected by the cleaning liquid injection unit 270, cleaning of the wafer 122 can be performed more effectively.

The cleaning liquid injection unit 270 may inject various types of cleaning liquid. For example, the cleaning liquid injection unit 270 may include a plurality of injection nozzles, and different types of cleaning liquid may be injected through at least some of the plurality of injection nozzles.

The operation of the wafer cleaning device 200 may be controlled by a control unit (e.g., a controller). For example, the control unit may control the brush mover 230, the brush rotator 240, the wafer driving unit 250, the cleaning liquid injection unit 270, and/or the like.

Referring to FIG. 4, the brushes 212 and 262 may include a brush body 310 and a plurality of protrusions 320. The brush body 310 may have an elongated shape that extends in one direction. For example, the brush body 310 may have a shape of cylinder elongated in the X-axis direction of FIG. 4. The brushes 212 and 262 may be connected to the brush mover 230 and/or the brush rotator 240. The brush body 310 may include the brush core 312 in the center. In this case, the brush mover 230 and/or the brush rotator 240 may be connected to the brush core 312. For example, the brush rotator 240 may provide rotational power to the brush core 312 and, accordingly, the brushes may be rotated by the rotational power provided from the brush rotator 240.

The protrusions 320 may be disposed on the surface of the brush body 310. For example, the protrusions 320 may be disposed on a surface of a side of the cylindrical shape of the brush body 310. While the brushes are cleaning the wafer 122, the protrusions 320 of the brushes 212 and 262 may be in direct contact with the wafer 122. The protrusion 320 may include a polyvinyl alcohol (PVA) and/or a polyvinyl chloride (PVC) material.

The brush (e.g., the first brush 212_1) placed in the wafer cleaning position is rotated by the brush rotator 240, and the protrusions 320 disposed on the surface of the brush body 310 may be sequentially brought into contact with the wafer 122. Accordingly, the wafer 122 can be better cleaned. In addition, the brushes (e.g., the second brush 212_2 and the third brush 212_3) placed in the brush cleaning position are rotated by the brush rotator 240, and the protrusions 320 disposed on the surface of the brush body 310 may be sequentially brought into contact with the brush cleaner 220. Accordingly, the brush 212 can be better cleaned.

The brushes 212 and 262 included in the first brush assembly 210 and the second brush assembly 260 may all be the same type of brushes. For example, the brushes 212 and 262 included in the first brush assembly 210 and the second brush assembly 260 may be brushes all having the same average height h, shape, average spacing d, material, etc., as those of the protrusions 320. Alternatively, at least two of the brushes 212 and 262 included in the first brush assembly 210 and the second brush assembly 260 may be different brushes. For example, at least two of the brushes 212 included in the first brush assembly 210 may be brushes that differ in at least one from among the average height h, shape, average spacing d, or material of the protrusions 320.

The brushes 212 and 262 may further include nozzles. For example, the nozzle may be formed on the surface of the brush body 310. Under this configuration, a cleaning liquid (e.g., deionized water) for cleaning the wafer 122 and/or cleaning the brushes 212 and 262 may be supplied into the brush body 310 and the cleaning liquid may be ejected through the nozzle formed on the surface of the brush body 310. Accordingly, cleaning of the wafer 122 and/or cleaning of the brushes 212 and 262 can be performed more effectively.

FIG. 3 illustrates that the wafer 122 is disposed in a horizontal direction, and the first brush assembly 210 and the second brush assembly 260 are disposed on the upper and lower sides of the wafer 122, respectively, but the scope of the present disclosure is not limited thereto. The wafer 122 may be disposed in a vertical direction, and the first brush assembly 210 and the second brush assembly 260 may be disposed on the left and right sides of the wafer 122, respectively. That is, the Z-axis direction of FIGS. 3 to 18 may be the vertical direction. For convenience of explanation, an embodiment will be illustrated and described below by referring to an example in which the wafer 122 is disposed in the horizontal direction, and the first brush assembly 210 and the second brush assembly 260 are disposed on the upper and lower sides of the wafer 122, respectively.

In FIGS. 5 to 18 and the following description, various aspects of the wafer cleaning device 200 are illustrated and described. Hereinbelow, any configuration or content that is redundant to the configuration or content already described above may be omitted or briefly described, and changes from the above will be mainly illustrated and described.

FIGS. 5 to 8 are views illustrating an example in which each of the plurality of brushes (e.g., the first brush 212_1, the second brush 212_2, and the third brush 212_3) is moved close to or away from the first axis. The brush mover 230 may individually move the positions of each of the plurality of brushes (e.g., the first brush 212_1, the second brush 212_2, and the third brush 212_3) such that each of the plurality of brushes (e.g., the first brush 212_1, the second brush 212_2, and the third brush 212_3) included in the first brush assembly 210 is moved close to or away from the first axis (e.g., the central axis 214). Accordingly, the degree of contact between the brush placed in the wafer cleaning position and the wafer 122 and/or the degree of contact (or distance, etc.) between the brush placed in the brush cleaning position and the brush cleaner 220 can be individually adjusted.

Figure 5:
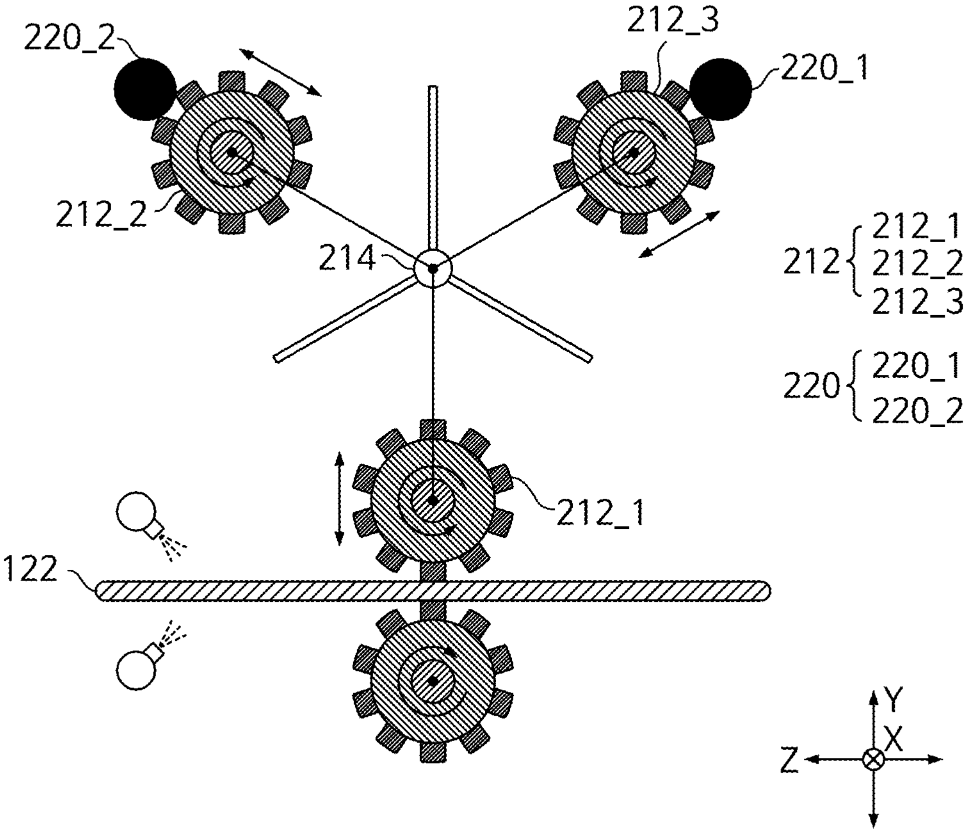
FIGS. 5 to 8 are views illustrating an example in which each of the plurality of brushes is moved close to or away from a first axis.

For example, as illustrated in FIG. 5, the first brush 212_1 may be placed in the wafer cleaning position near the wafer 122, and the third brush 212_3 and the second brush 212_2 may be placed in the first brush cleaning position near the first brush cleaner 220_1 and the second brush cleaning position near the second brush cleaner 220_2, respectively.

Figure 6:
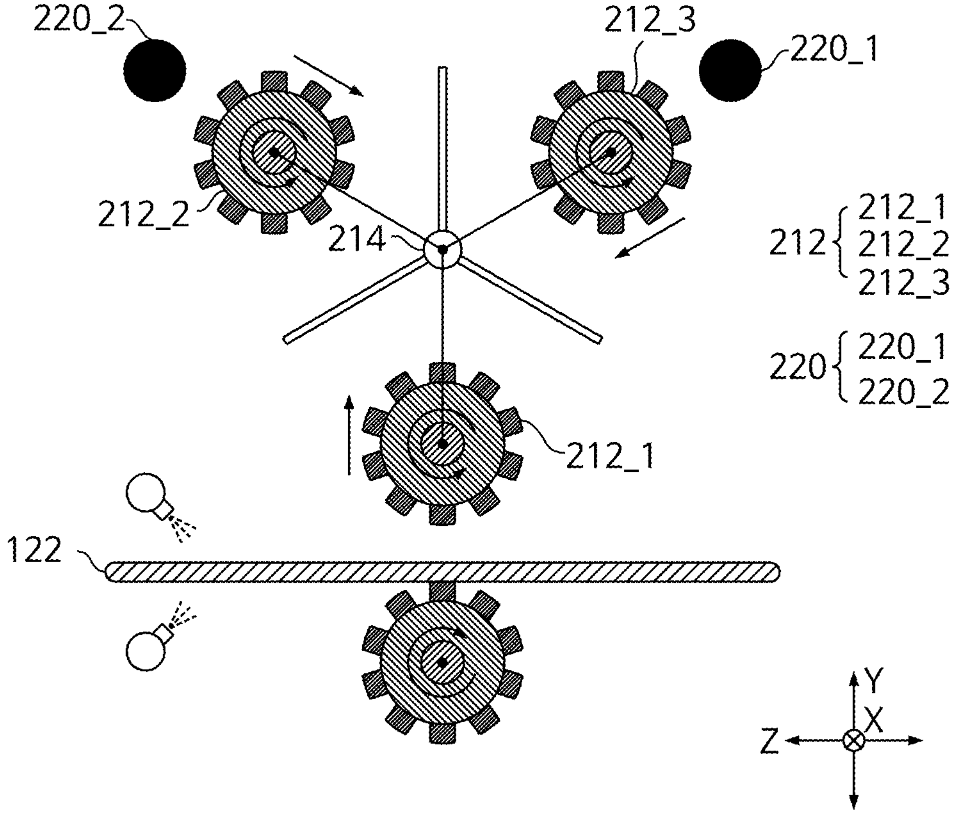

As illustrated in FIG. 6, the first brush 212_1, the second brush 212_2 and the third brush 212_3 may be moved such that each of the first brush 212_1, the second brush 212_2, and the third brush 212_3 is moved close to the central axis 214. Accordingly, the first brush 212_1 placed in the wafer cleaning position may be moved away from the wafer 122, and each of the second brush 212_2 and the third brush 212_3 placed in the brush cleaning position may be moved away from the second brush cleaner 220_2 and the first brush cleaner 220_1.

Figure 7:
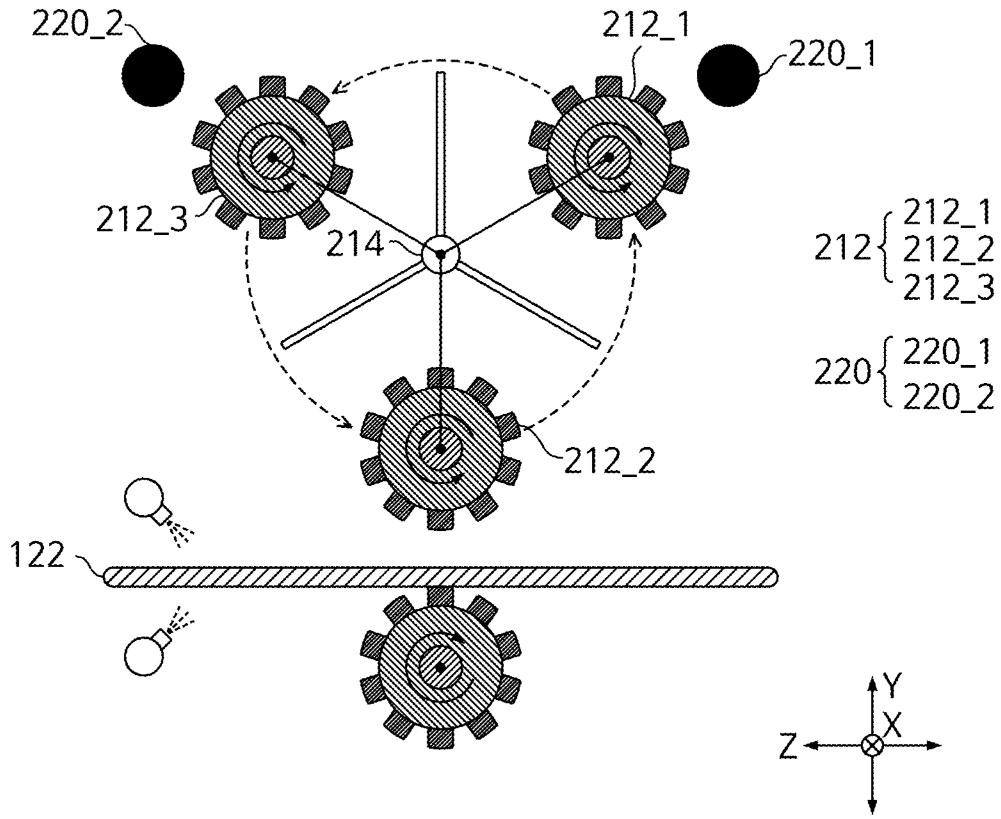

As illustrated in FIG. 7, the plurality of brushes (e.g., the first brush 212_1, the second brush 212_2, and the third brush 212_3) may be moved in rotation. For example, the plurality of brushes (e.g., the first brush 212_1, the second brush 212_2, and the third brush 212_3) may be moved counterclockwise around the first axis (e.g., the central axis 214), and accordingly, the first brush 212_1 may be moved to the first brush cleaning position near the first brush cleaner 220_1, the second brush 212_2 may be moved to the wafer cleaning position, and the third brush 212_3 may be moved to the second brush cleaning position near the second brush cleaner 220_2. As described above, if the brushes are moved close to the central axis 214 before the brushes 212 are moved in rotation, the rotational movement may not be interfered with by other components (e.g., the wafer 122, brush cleaners, etc.) during the rotational movement, and the position of the brush 212 may be shifted smoothly.

Figure 8:
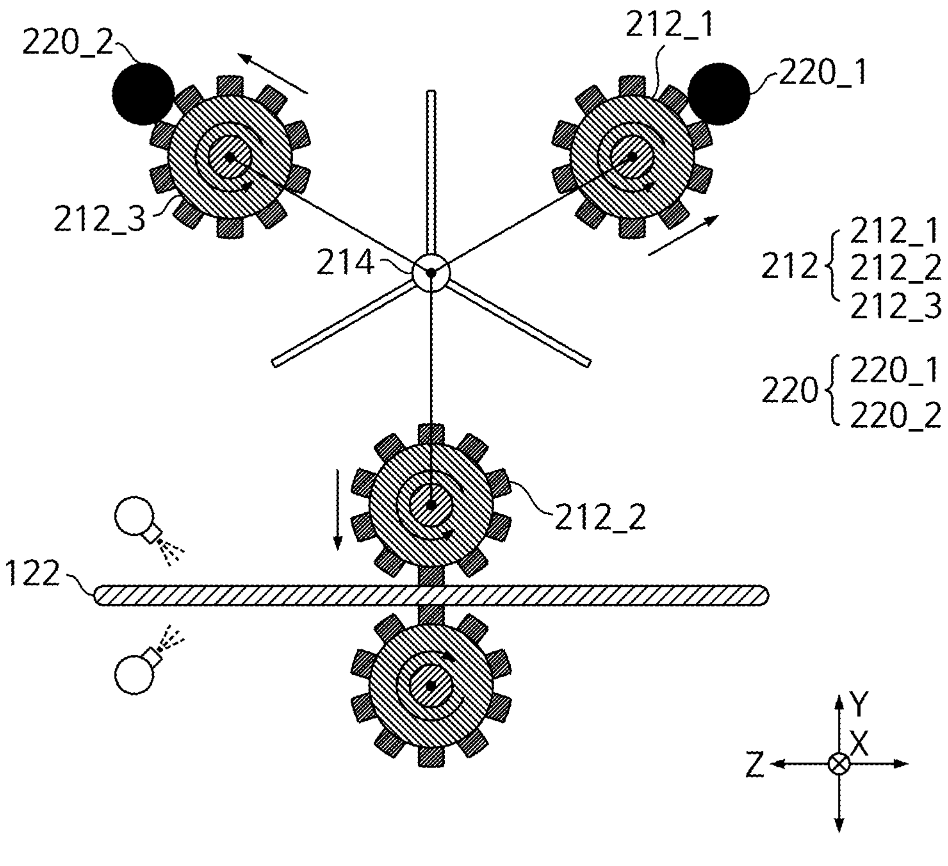

As illustrated in FIG. 8, the first brush 212_1, the second brush 212_2 and the third brush 212_3 may be moved such that each of the first brush 212_1, the second brush 212_2, and the third brush 212_3 is moved away from the central axis 214. Accordingly, the second brush 212_2 placed in the wafer cleaning position may be moved close to the wafer 122, and the second brush 212_2 and the third brush 212_3 placed in the brush cleaning position may be moved away from the second brush cleaner 220_2 and the first brush cleaner 220_1, respectively. The moving distance of the second brush 212_2 may be adjusted according to the degree of contact with the wafer 122. Accordingly, the wafer 122 can be effectively cleaned by the second brush 212_2. Additionally or alternatively, the moving distances of the first brush 212_1 and the third brush 212_3 may be adjusted according to the degree of contact with the first brush cleaner 220_1 and the degree of contact with the second brush cleaner 220_2, respectively. Accordingly, the first brush 212_1 and the third brush 212_3 can be effectively cleaned by the brush cleaner 220.

In the examples illustrated in FIGS. 5 to 8, the plurality of brushes (e.g., the first brush 212_1, the second brush 212_2, and the third brush 212_3) included in the first brush assembly 210 are all moved close to the first axis, or the plurality of brushes (e.g., the first brush 212_1, the second brush 212_2, and the third brush 212_3) are all moved away from the first axis, but embodiments are not limited thereto. For example, some of the plurality of brushes (e.g., the first brush 212_1, the second brush 212_2, and the third brush 212_3) included in the first brush assembly 210 may be moved close to the first axis, and at the same time, others may be moved close to the first axis.

Figure 9:
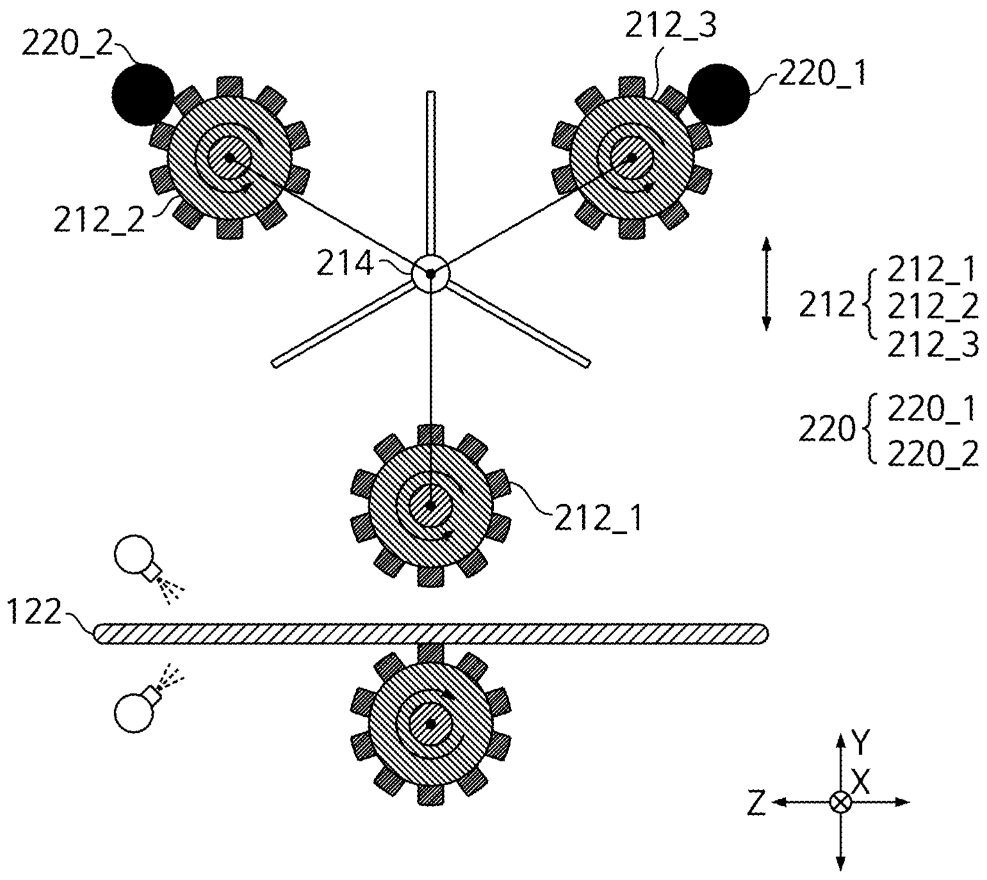
FIGS. 9 and 10 are diagrams illustrating an example in which the plurality of brushes are moved such that the brush placed in the wafer cleaning position is moved close to or away from the wafer position.
Figure 10:
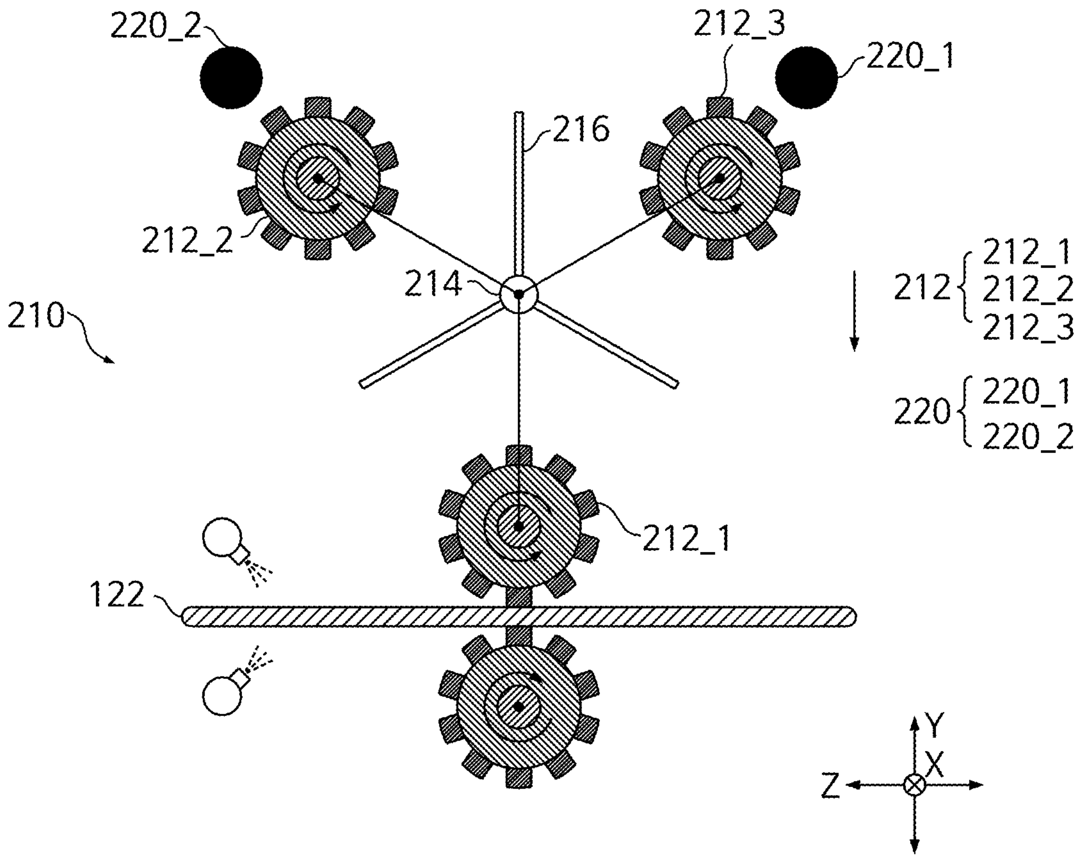

FIGS. 9 and 10 are diagrams illustrating an example in which the plurality of brushes (e.g., the first brush 212_1, the second brush 212_2, and the third brush 212_3) are moved such that the brush placed in the wafer cleaning position is moved close to or away from the wafer position. In order to adjust the degree of contact between the brush 212 placed in the wafer cleaning position and the wafer 122, the brush mover 230 may move the plurality of brushes (e.g., the first brush 212_1, the second brush 212_2, and the third brush 212_3) such that the brush 212 placed in the wafer cleaning position is moved close to or away from the wafer 122.

For example, as illustrated in FIG. 9, the first brush 212_1 may be placed in the wafer cleaning position near the wafer 122, and the third brush 212_3 and the second brush 212_2 may be placed in the first brush cleaning position near the first brush cleaner 220_1 and the second brush cleaning position near the second brush cleaner 220_2, respectively. As illustrated in FIG. 9, if the first brush 212_1 placed in the wafer cleaning position is not sufficiently in contact with the wafer 122, the wafer 122 may not be cleaned effectively.

As illustrated in FIG. 10, in order to adjust the degree of contact between the brush 212 and the wafer 122, the plurality of brushes (e.g., the first brush 212_1, the second brush 212_2, and the third brush 212_3) may be moved in one direction (e.g., downward in FIG. 10) at the same time such that the first brush 212_1 placed in the wafer cleaning position is moved close to the wafer 122.

If the plurality of brushes (e.g., the first brush 212_1, the second brush 212_2, and the third brush 212_3) are moved in one direction at the same time, other components (e.g., the central axis 214 and the blocking wall 216) included in the first brush assembly 210 may also be moved in one direction together with the brushes 212. Additionally or alternatively, the brush cleaner 220 may be moved to adjust the degree of contact (or distance, etc.) between the brush 212 placed in the brush cleaning position and the brush cleaner 220. For example, the wafer cleaning device 200 may further include a cleaner driving unit configured to be connected to the brush cleaner 220 and move the brush cleaner 220. In this case, by the cleaner driving unit, the first brush cleaner 220_1 may be moved close to the third brush 212_3, and the second brush cleaner 220_2 may be moved close to the second brush 212_2.

FIGS. 11 to 14 are diagrams illustrating an example of cleaning the wafer 122 according to various examples. Utilizing the wafer cleaning device 200, it is possible to clean both the brushes 212 and the wafers 122 at the same time.

Figure 11:
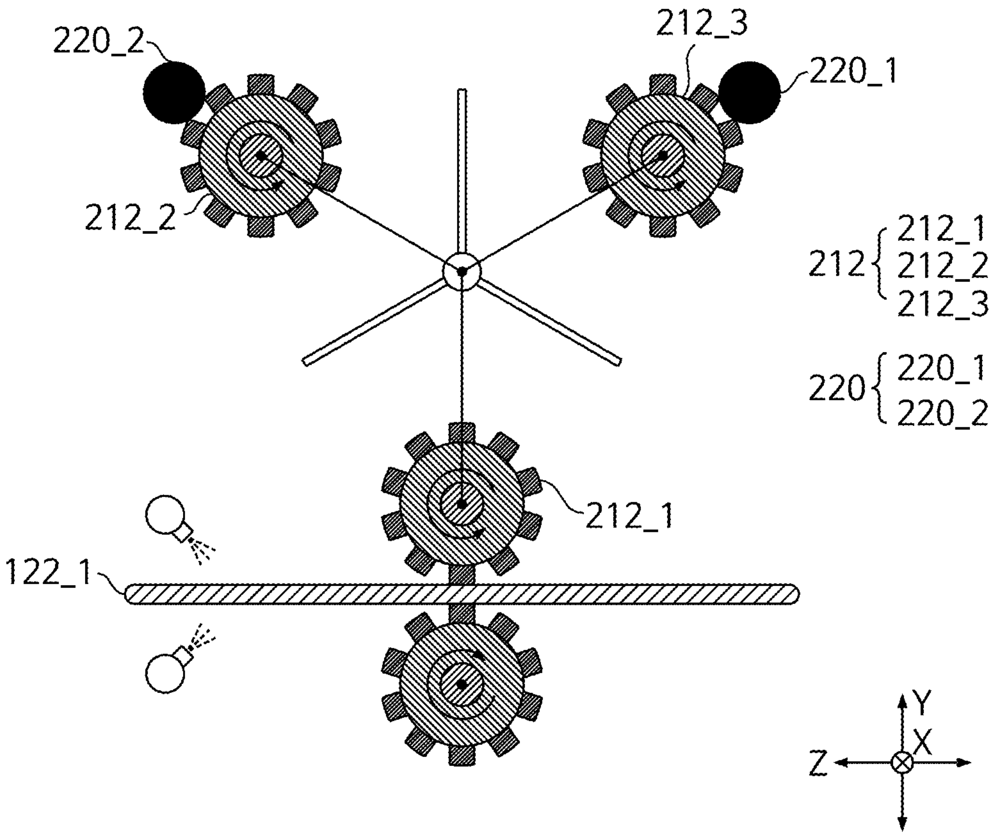
FIGS. 11 to 14 are diagrams illustrating an example of cleaning a wafer according to various examples.

Cleaning one wafer 122 may involve using one brush 212. For example, first, as illustrated in FIG. 11, a first wafer 122_1 may be placed in the wafer position. In addition, the first brush 212_1 may be placed in the wafer cleaning position near the wafer 122, and the third brush 212_3 and the second brush 212_2 may be placed in the first brush cleaning position near the first brush cleaner 220_1 and the second brush cleaning position near the second brush cleaner 220_2, respectively.

The first brush 212_1 placed in the wafer cleaning position is rotated, and the first wafer 122_1 placed in the wafer position may be cleaned. At this time, the first wafer 122_1 may also be rotated such that the first wafer 122_1 can be cleaned more effectively. While the first wafer 122_1 is being cleaned, the second brush 212_2 and the third brush 212_3 may be cleaned by the second brush cleaner 220_2 and the first brush cleaner 220_1, respectively. Because the second brush 212_2 and the third brush 212_3 are also rotated during the rotation of the first brush 212_1, the second brush 212_2 and the third brush 212_3 may be cleaned more effectively.

Figure 12:
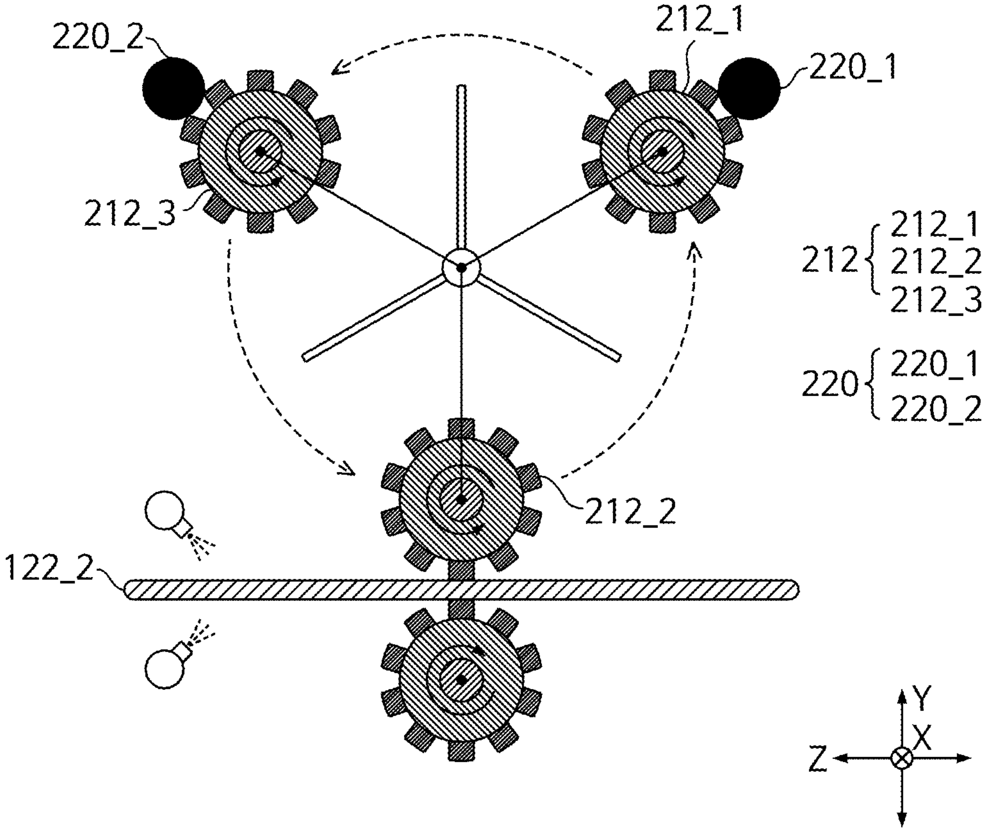

As illustrated in FIG. 12, the position of the brush 212 may be shifted. For example, the plurality of brushes 212 may be moved in rotation counterclockwise around the first axis and, accordingly, the first brush 212_1 may be moved to the first brush cleaning position near the first brush cleaner 220_1, the second brush 212_2 may be moved to the wafer cleaning position, and the third brush 212_3 may be moved to the second brush cleaning position near the second brush cleaner 220_2. In addition, the wafer 122 placed in the wafer position, that is, the first wafer 122_1, may be replaced with a second wafer 122_2. For example, by the transfer unit (e.g., the transfer unit 168 in FIG. 1) of the wafer 122 polishing equipment, the first wafer 122_1 placed in the wafer position may be removed, and the second wafer 122_2 may be placed in the wafer position.

The second brush 212_2 (and the second wafer 122_2) placed in the wafer cleaning position may be rotated, and the second wafer 122_2 placed in the wafer position may be cleaned. While the second wafer 122_2 is being cleaned, the first brush 212_1 and the third brush 212_3 may be cleaned by the first brush cleaner 220_1 and the second brush cleaner 220_2, respectively.

Additionally or alternatively, cleaning one wafer 122 may involve using a plurality of brushes 212.

Figure 13:
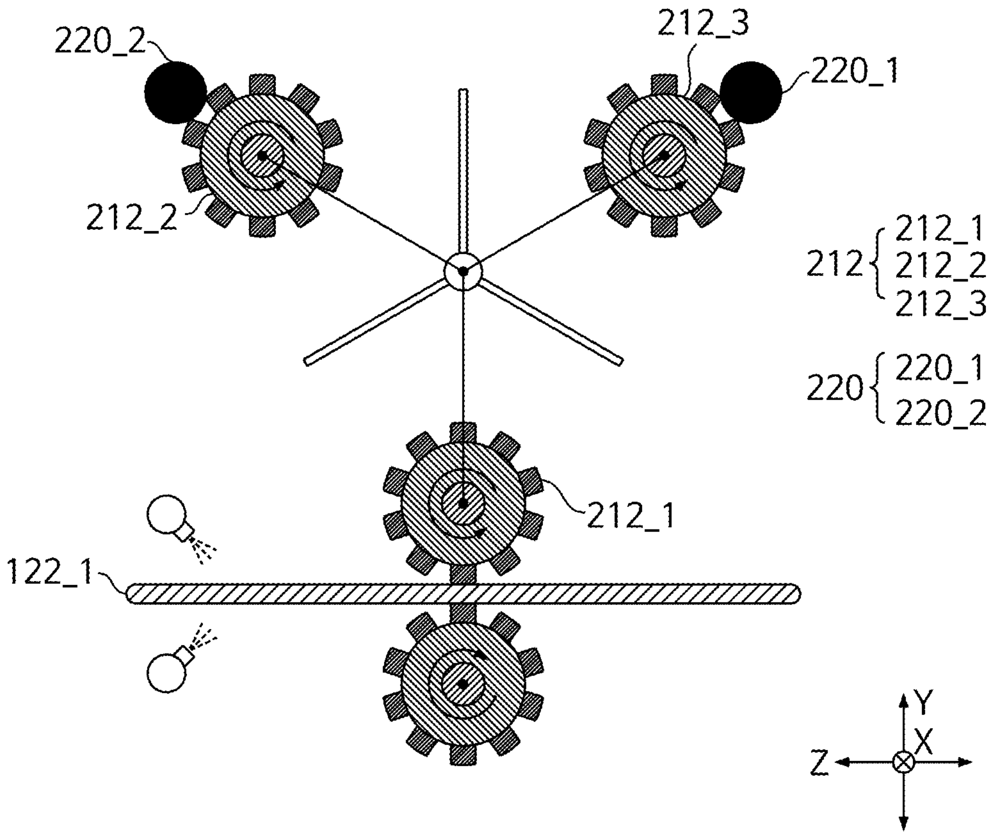

For example, first, as illustrated in FIG. 13, the first wafer 122_1 may be placed in the wafer position. In addition, the first brush 212_1 may be placed in the wafer cleaning position near the wafer 122, and the third brush 212_3 and the second brush 212_2 may be placed in the first brush cleaning position near the first brush cleaner 220_1 and the second brush cleaning position near the second brush cleaner 220_2, respectively.

The first brush 212_1 (and the first wafer 122_1) placed in the wafer cleaning position may be rotated, and the first wafer 122_1 placed in the wafer position may be cleaned. While the first wafer 122_1 is being cleaned, the second brush 212_2 and the third brush 212_3 may be cleaned by the second brush cleaner 220_2 and the first brush cleaner 220_1, respectively.

Figure 14:
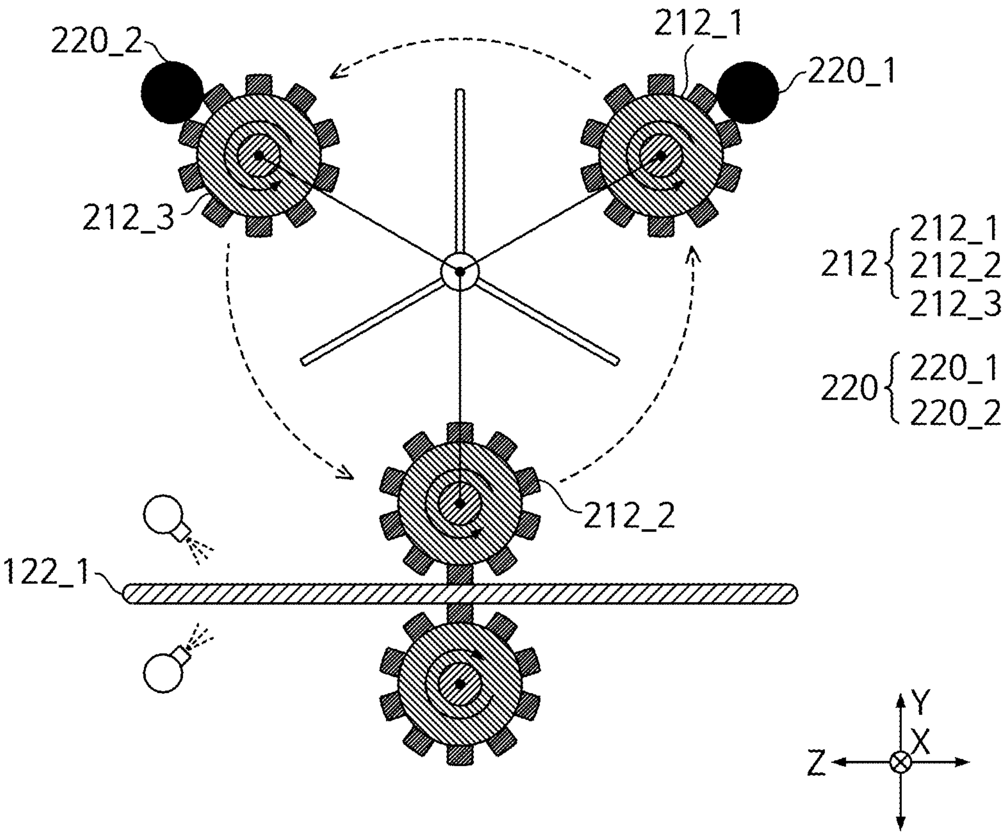

As illustrated in FIG. 14, the position of the brush 212 may be shifted. For example, the plurality of brushes 212 may be moved in rotation counterclockwise around the first axis, and accordingly, the first brush 212_1 may be moved to the first brush cleaning position near the first brush cleaner 220_1, the second brush 212_2 may be moved to the wafer cleaning position, and the third brush 212_3 may be moved to the second brush cleaning position near the second brush cleaner 220_2.

The second brush 212_2 (and the first wafer 122_1) placed in the wafer cleaning position may be rotated, and the first wafer 122_1 placed in the wafer position may be cleaned again. The first brush 212_1 and the second brush 212_2 may be different types of brushes. For example, the first brush 212_1 and the second brush 212_2 may be brushes that differ in at least one from among the height, shape, spacing, or material of the protrusion. In such example, the wafer 122 may be repeatedly cleaned by the plurality of brushes 212 of different types and, accordingly, polishing debris on the surface of the wafer 122 can be more effectively removed.

Figure 15:
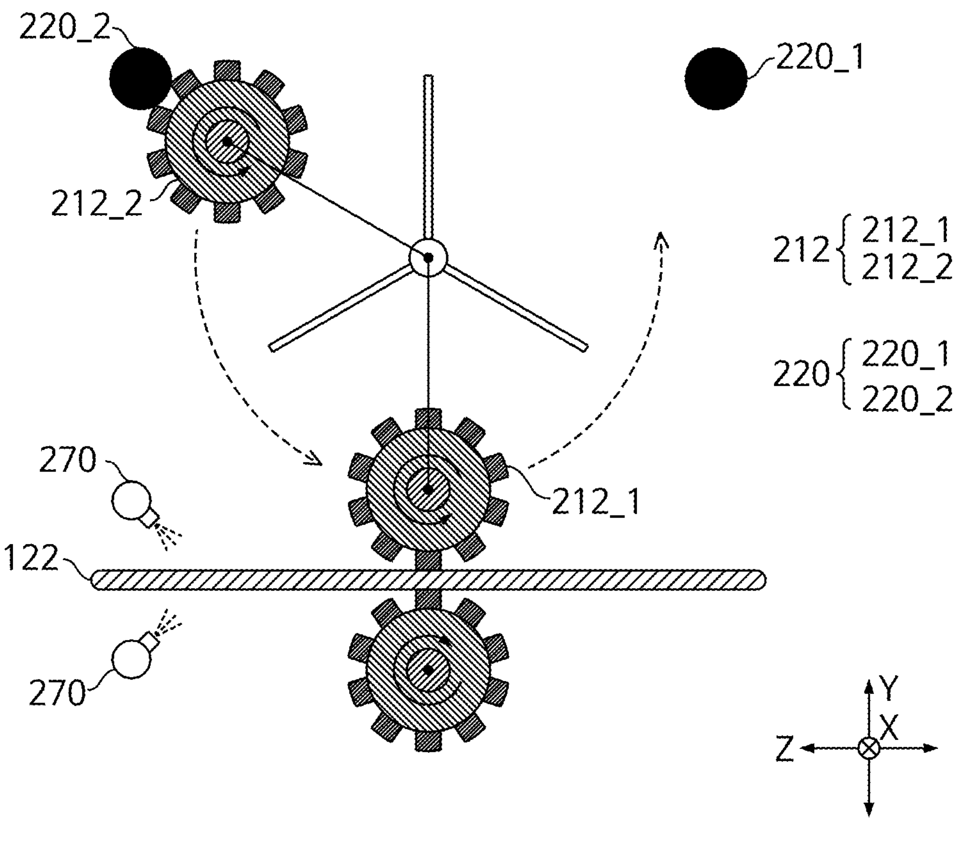
FIGS. 15 to 17 are diagrams illustrating an example in which a direction of rotational movement of the plurality of brushes is changed.
Figure 16:
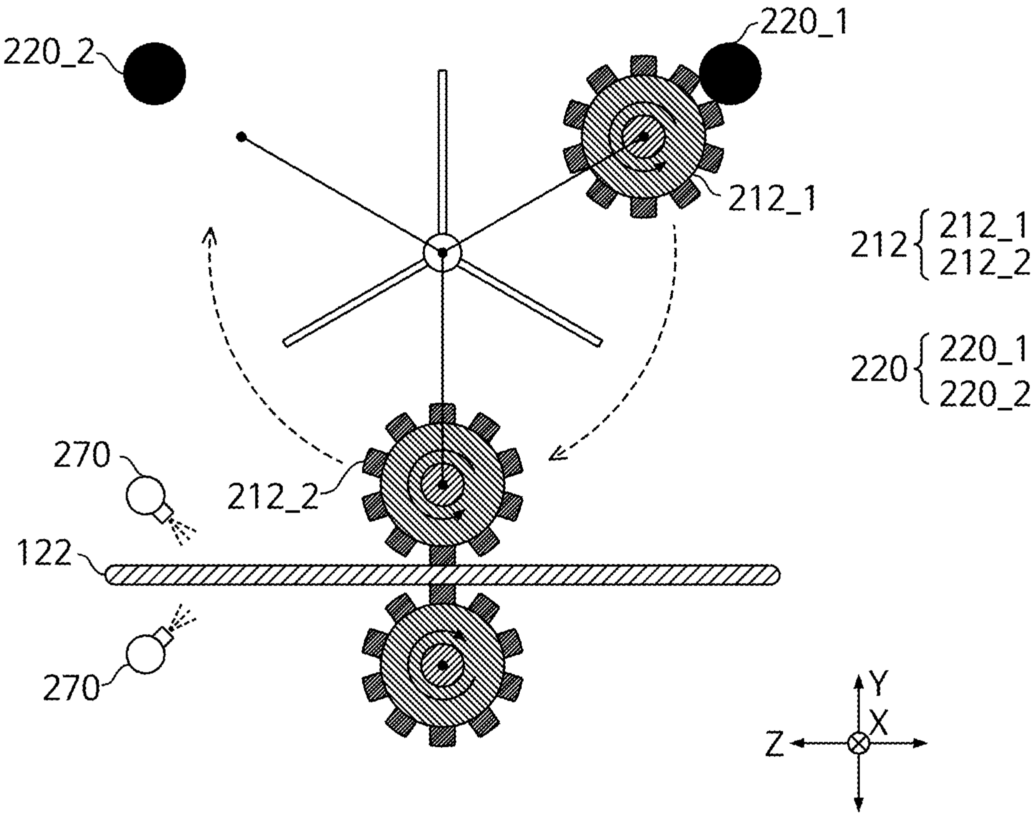
Figure 17:
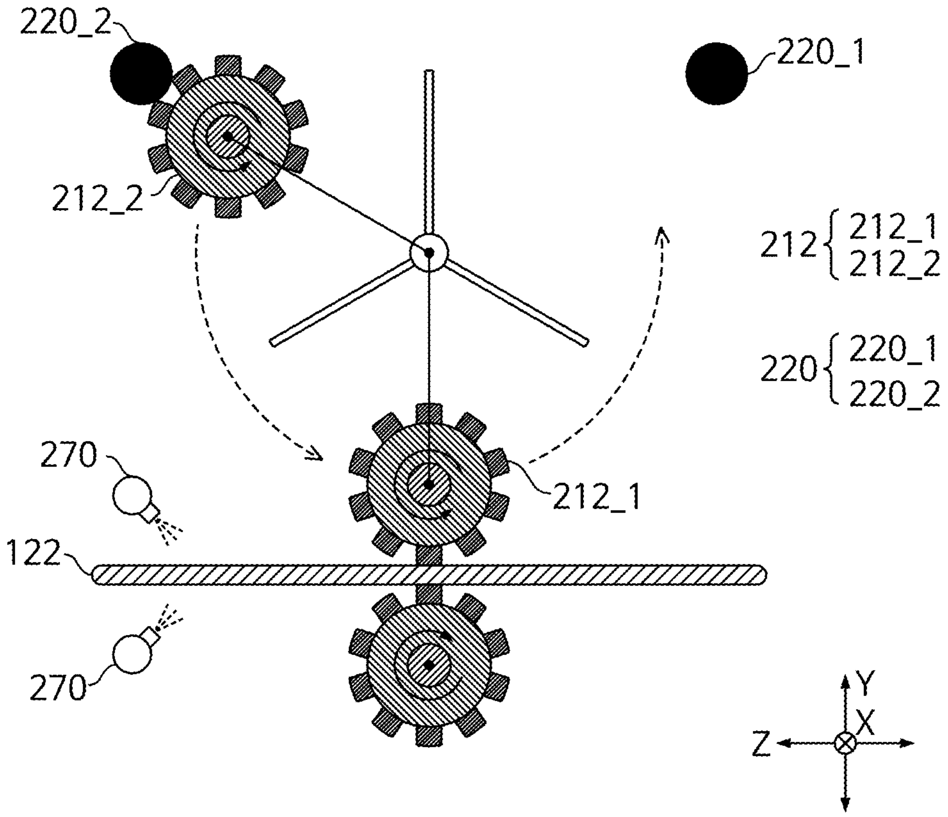

FIGS. 15 to 17 are diagrams illustrating an example in which a direction of rotational movement of the plurality of brushes 212 is changed. The brush mover 230 may change the direction of rotational movement each time the brush mover 230 shifts the positions of the plurality of brushes 212.

For example, first, as illustrated in FIG. 15, the first brush 212_1 may be placed in the wafer cleaning position near the first surface F of the wafer position, and the second brush 212_2 may be placed in the second brush cleaning position near the second brush cleaner 220_2. The wafer 122 placed in the wafer position may be cleaned by the first brush 212_1. While the first brush 212_1 is cleaning the wafer 122, the cleaning liquid injection unit 270 may inject the first cleaning liquid (e.g., a cleaning liquid containing ammonia water ($NH_4OH$)). While the wafer 122 is being cleaned by the first brush 212_1, the second brush 212_2 may be cleaned by the second brush cleaner 220_2.

The first brush 212_1 and the second brush 212_2 may be moved in rotation. For example, the first brush 212_1 and the second brush 212_2 may be moved in a first direction (e.g., in a counterclockwise direction) in rotation around the first axis. As a result, as illustrated in FIG. 16, the first brush 212_1 may be moved to the first brush cleaning position near the first brush cleaner 220_1, and the second brush 212_2 may be moved to the wafer cleaning position. The wafer 122 placed in the wafer position may be cleaned by the second brush 212_2. While the second brush 212_2 is cleaning the wafer 122, the cleaning liquid injection unit 270 may inject the second cleaning liquid (e.g., a cleaning liquid containing hydrofluoric acid (HF)). While the wafer 122 is being cleaned by the second brush 212_2, the first brush 212_1 may be cleaned by the first brush cleaner 220_1.

Then, the first brush 212_1 and the second brush 212_2 may be moved in rotation in a direction opposite to the previous direction. For example, the first brush 212_1 and the second brush 212_2 may be moved in a second direction (e.g., in a clockwise direction) in rotation around the first axis. As a result, as illustrated in FIG. 17, the first brush 212_1 may be moved to the wafer cleaning position, and the second brush 212_2 may be moved to the second brush cleaning position near the second brush cleaner 220_2. The wafer 122 placed in the wafer position may be cleaned by the first brush 212_1. While the first brush 212_1 is cleaning the wafer 122, the cleaning liquid injection unit 270 may inject the first cleaning liquid. While the wafer 122 is being cleaned by the first brush 212_1, the second brush 212_2 may be cleaned by the second brush cleaner 220_2.

As described above, if the direction of the rotational movement is shifted whenever the positions of the brushes 212 are changed, the first brush 212_1 may be cleaned only by the first brush cleaner 220_1 and the second brush 212_2 may be cleaned only by the second brush cleaner 220_2. If the cleaning liquid (first cleaning liquid) used to clean the wafer 122 using the first brush 212_1 and the cleaning liquid (second cleaning liquid) used to clean the wafer 122 using the second brush 212_2 are different from each other, by changing the direction of the rotational movement when shifting the positions of the brushes 212, each brush 212 can be cleaned only by a dedicated one of the brush cleaners 220 and, as a result, it is possible to prevent the cleaning liquid remaining on one brush 212 from being transferred to another brush 212 through the brush cleaner 220.

Figure 18:
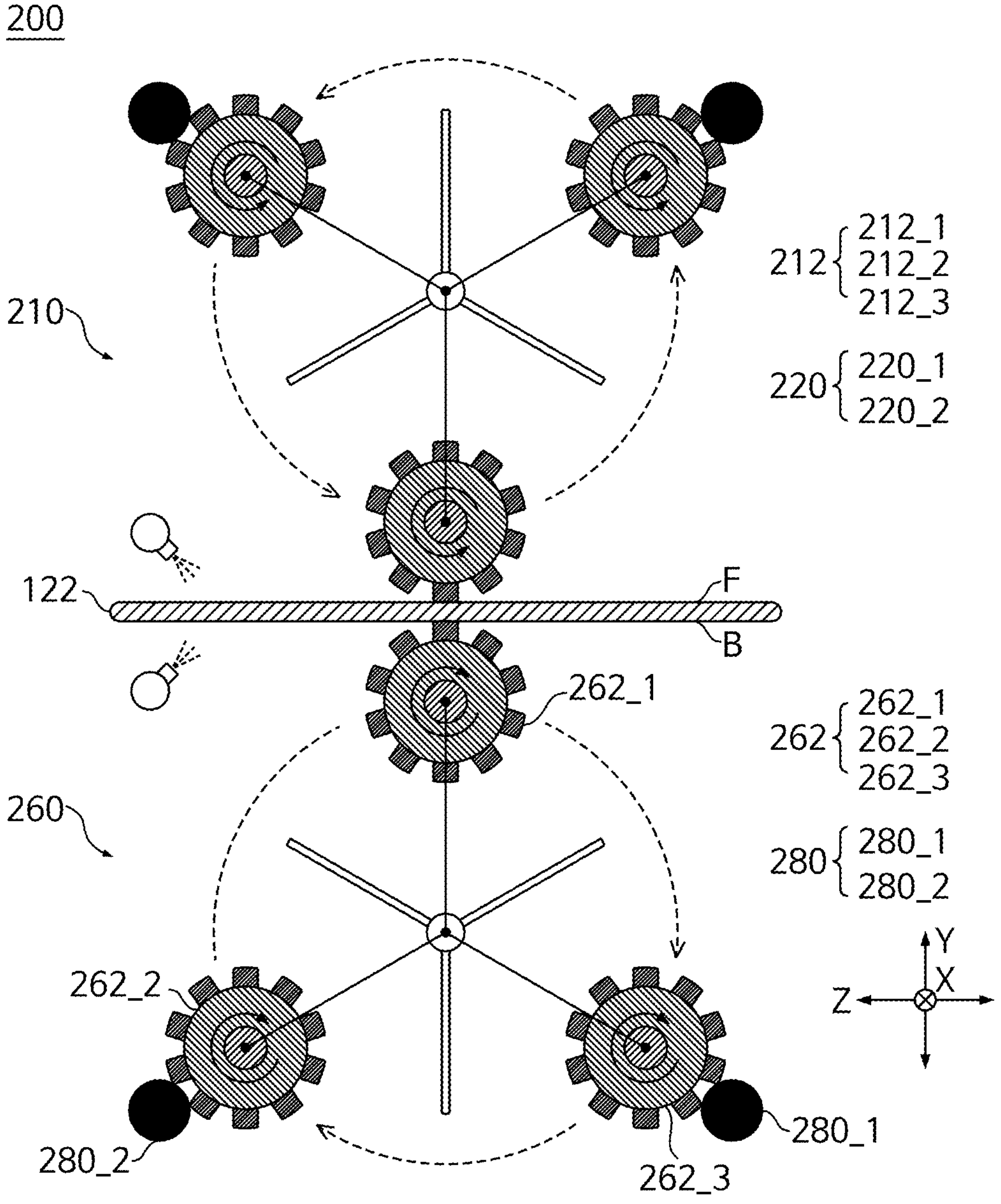
FIG. 18 is a diagram illustrating an example of the wafer cleaning device.

FIG. 18 is a diagram illustrating an example of the wafer cleaning device 200. The wafer cleaning device 200 may include the second brush assembly 260 disposed on the second surface B (or on the second surface B side) opposite to the first surface F of the wafer 122 (or the wafer position). The second brush assembly 260 may include a plurality of brushes 262_1, 262_2, and 262_3 for cleaning the second surface B of the wafer 122. In addition, the wafer cleaning device 200 may further include brush cleaners 280_1 and 280_2 disposed on the second surface B of the wafer 122 to clean the plurality of brushes 262_1, 262_2, and 262_3 included in the second brush assembly 260. The second brush assembly 260 including a plurality of brushes may be the same as or similar to the first brush assembly 210. Therefore, the description of the first brush assembly 210 described above with reference to FIGS. 3 to 17 may be equally or similarly applied to the second brush assembly 260.

The first surface F of the wafer 122 (e.g., the front surface of the wafer 122) may be a surface polished by the polishing module. In this case, the number of brushes 212 included in the first brush assembly 210 disposed on the first surface F side of the wafer 122 may be greater than the number of brushes 262 included in the second brush assembly 260 disposed on the second surface B (e.g., the rear surface of the wafer 122).

Figure 19:
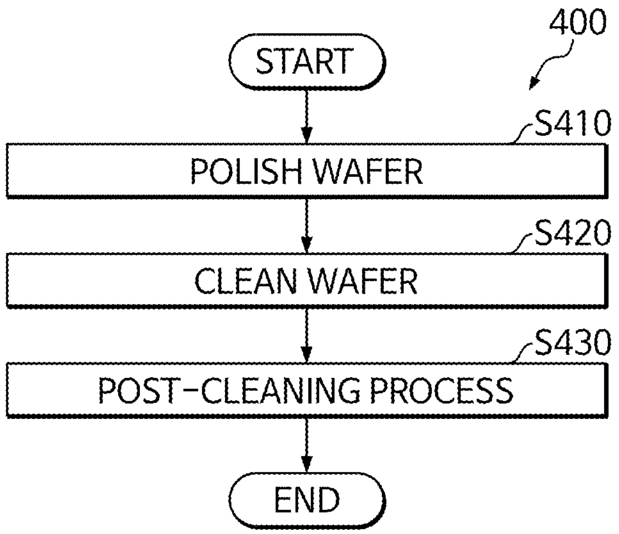
FIG. 19 is a flowchart illustrating an example of a method for polishing a wafer.

FIG. 19 is a flowchart illustrating an example of a method 400 for polishing a wafer. The method 400 for polishing the wafer may be performed by wafer polishing equipment (e.g., the wafer polishing equipment 100 in FIG. 1) including a wafer cleaner (e.g., wafer cleaning device 200 in FIG. 3 or FIG. 18).

The wafer may be polished by a polishing module (e.g., the polishing module 106 of FIG. 1) of the wafer polishing equipment, at operation S410. For example, the first surface F of the wafer may be polished by a polishing module including one or more chemical mechanical polishing stations. The polished wafer may be transferred to the wafer cleaner included in the wafer polishing equipment.

The wafer transferred to the wafer cleaner may be cleaned by the wafer cleaner (e.g., the wafer cleaning device 200 of FIG. 3 or 18), at operation S420. For example, polishing debris, etc., that may remain on the surface of the wafer after polishing may be cleaned by the brush included in the wafer cleaner.

A post-cleaning process may be performed on the wafer cleaned at the wafer cleaner, at operation S430. For example, the cleaned wafer may be transferred to a drying module and may be dried by the drying module.

Figure 20:
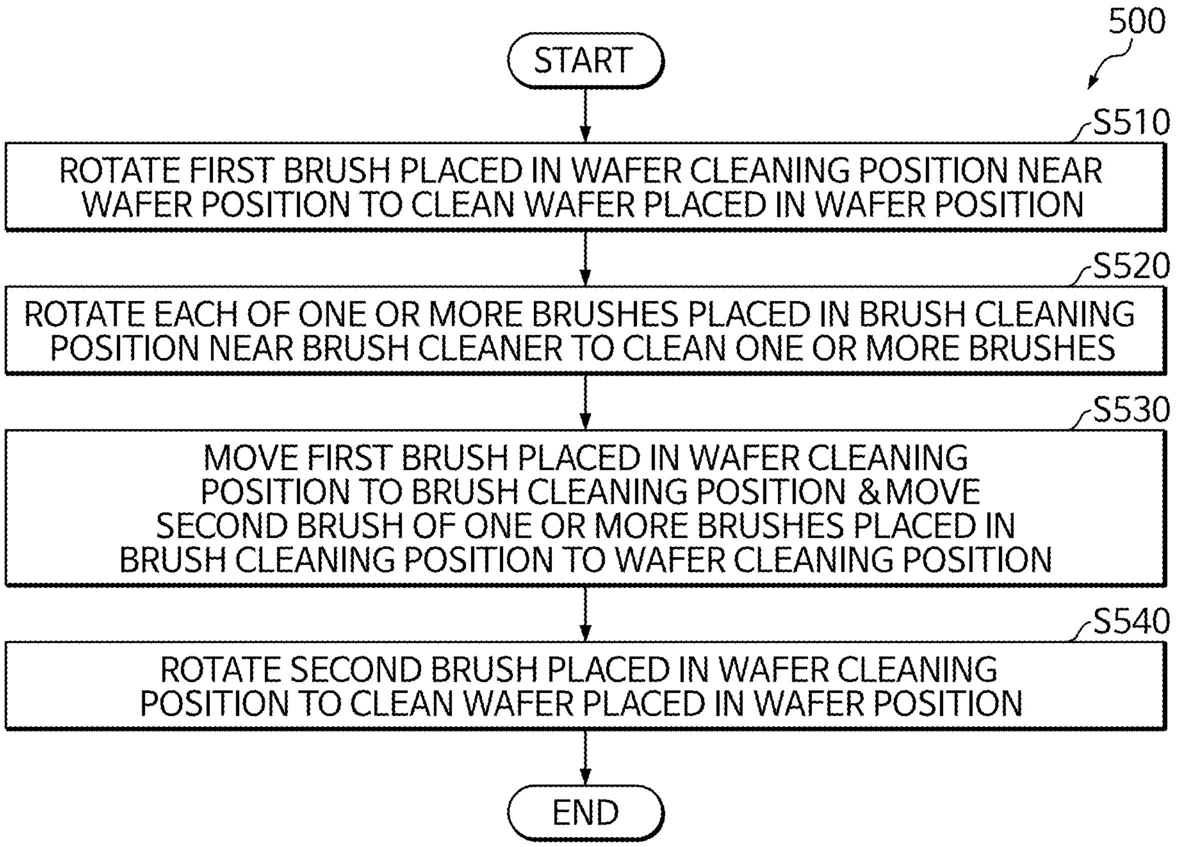
FIG. 20 is a flowchart illustrating an example of a method for cleaning a wafer.

FIG. 20 is a flowchart illustrating an example of a method 500 for cleaning a wafer. The method 500 for cleaning the wafer may be performed by a wafer cleaning device (e.g., the wafer cleaning device 200 in FIG. 3 or FIG. 18) or wafer polishing equipment (e.g., the wafer polishing equipment 100 in FIG. 1) including the wafer cleaner.

The method 500 may be initiated in a state in which a first brush is placed in the wafer cleaning position near the wafer position and one or more brushes are placed in the brush cleaning position near the brush cleaner.

The brush rotator of the wafer cleaning device may rotate the first brush placed in the wafer cleaning position to clean the wafer placed in the wafer position, at operation S510. For example, the brush rotator may rotate the first brush placed in the wafer cleaning position to clean the first wafer placed in the wafer position. While the wafer placed in the wafer position is being cleaned, the wafer driving unit 250 of the wafer cleaning device may rotate the wafer placed in the wafer position. In addition, while rotating the first brush, the brush rotator may concurrently rotate each of one or more brushes placed in the brush cleaning position near the brush cleaner to clean the one or more brushes, at operation S520.

The brush mover may move the first brush placed in the wafer cleaning position to the brush cleaning position, and move the second brush among one or more brushes placed in the brush cleaning position to the wafer cleaning position, at operation S530. For example, by moving the first brush placed in the wafer cleaning position and one or more brushes placed in the brush cleaning position in the first direction in rotation around the first axis, the brush mover may move the first brush to the brush cleaning position and move the second brush among one or more brushes placed in the brush cleaning position to the wafer cleaning position.

The brush rotator may rotate the second brush placed in the wafer cleaning position to clean the wafer placed in the wafer position, at operation S540. For example, the brush rotator may rotate the first brush placed in the wafer cleaning position to clean the first wafer placed in the wafer position. Before operation S540, the wafer placed in the wafer position, that is, the first wafer, may be replaced with the second wafer. For example, before operation S540, the transfer unit (e.g., the transfer unit 168 in FIG. 1) of the wafer polishing equipment may transfer the first wafer and the second wafer such that the second wafer is placed in the wafer position instead of the first wafer. In this case, the brush rotator may rotate the first brush placed in the wafer cleaning position to clean the second wafer placed in the wafer position. In addition, while rotating the second brush, the brush rotator may concurrently rotate the first brush placed in the brush cleaning position near the brush cleaner to clean the first brush, at operation S550.

The direction of rotational movement of the brush may be changed. For example, after operation S550, the brush mover may move the first brush and one or more brushes in a second direction opposite to the first direction in rotation around the first axis, so as to move the second brush placed in the wafer cleaning position to the brush cleaning position and to move the first brush placed in the brush cleaning position to the wafer cleaning position.

Example embodiments of the present disclosure have been described above for purposes of illustration only, and persons of ordinary skill in the art, in view of the present disclosure, will be able to make various modifications, changes, and additions within the spirit and scope of the present disclosure, and such modifications, changes, and additions should be construed to be included in the scope of the present disclosure.

It should be understood that those of ordinary skill in the art to which the present disclosure pertains can make various substitutions, modifications and changes without departing from the technical spirit of the present disclosure and, thus, the present disclosure is not limited by the aspects described above and the accompanying drawings.

What is claimed is:

1. A wafer cleaning device comprising:

a first brush assembly on a first side of a wafer and comprising a plurality of brushes configured to clean a first surface of the wafer;

a first brush cleaner configured to clean the plurality of brushes of the first brush assembly;

a brush mover comprising at least one actuator, the brush mover connected to the plurality of brushes of the first brush assembly and configured to move positions of the plurality of brushes; and a brush rotator comprising at least one actuator, the brush rotator connected to the plurality of brushes of the first brush assembly and configured to rotate each of the plurality of brushes, wherein the brush mover is further configured to move each of the plurality of brushes in rotation around a first axis, the first axis surrounded by the plurality of brushes and being a central rotational axis of the plurality of brushes.

2. The wafer cleaning device according to claim 1, wherein the brush mover is further configured to move the plurality of brushes to a wafer cleaning position adjacent to the first surface of the wafer and to a brush cleaning position adjacent to the first brush cleaner by rotating the plurality of brushes around the first axis.

3. The wafer cleaning device according to claim 2, wherein the brush mover is further configured to:

move a brush of the plurality of brushes, that is in the wafer cleaning position, to the brush cleaning position by rotating the brush around the first axis; and move at least one of the plurality of brushes, that is in the brush cleaning position, to the wafer cleaning position by rotating the at least one of the plurality of brushes around the first axis.

4. The wafer cleaning device according to claim 1, wherein the brush rotator is further configured to rotate each of the plurality of brushes around a respective second axis among second axes that are within each of the plurality of brushes, and wherein the first axis and the second axes are parallel to each other.

5. The wafer cleaning device according to claim 1, wherein the brush mover is further configured to move each of the plurality of brushes towards or away from the first axis.

6. The wafer cleaning device according to claim 1, wherein the brush mover is further configured to move the plurality of brushes such that a brush of the plurality of brushes, positioned adjacent to the wafer, is moved towards or away from the wafer.

7. The wafer cleaning device according to claim 1, wherein the brush mover is further configured to move the plurality of brushes in a clockwise direction or a counter-clockwise direction around the first axis.

8. The wafer cleaning device according to claim 1, wherein at least two of the plurality of brushes of the first brush assembly are different types of brushes from each other.

9. The wafer cleaning device according to claim 8, wherein each of the plurality of brushes of the first brush assembly comprises a protrusion, and wherein the at least two of the plurality of brushes differ in at least one from among a height of the protrusion, a shape of the protrusion, a spacing of the protrusion, and a material of the protrusion.

10. The wafer cleaning device according to claim 1, wherein the first surface of the wafer is a polished surface.

11. The wafer cleaning device according to claim 1, wherein the first brush assembly further comprises a blocking wall between adjacent brushes of the plurality of brushes.

12. The wafer cleaning device according to claim 1, further comprising:

a second brush assembly on a second side, opposite the first side, of the wafer and comprising one or more brushes configured to clean a second surface of the wafer, opposite to the first surface; and a second brush cleaner configured to clean the one or more brushes of the second brush assembly.

13. The wafer cleaning device according to claim 12, wherein a total number of brushes of the first brush assembly is greater than a total number of brushes of the second brush assembly.

14. Wafer polishing equipment, comprising:

a polisher configured to polish a first surface of a wafer; and a wafer cleaner configured to clean the wafer polished by the polisher, wherein the wafer cleaner comprises:

a brush assembly on a first side of the wafer and comprising a plurality of brushes configured to clean the first surface of the wafer;

a brush cleaner configured to clean the plurality of brushes of the brush assembly;

a brush mover comprising at least one actuator, the brush mover connected to the plurality of brushes of the brush assembly and configured to move positions of the plurality of brushes; and a brush rotator comprising at least one actuator, the brush rotator connected to the plurality of brushes of the brush assembly and configured to rotate each of the plurality of brushes, and wherein the brush mover is further configured to move each of the plurality of brushes in rotation around a first axis, the first axis surrounded by the plurality of brushes and being a central rotational axis of the plurality of brushes.

15. The wafer polishing equipment according to claim 14, wherein the brush mover is further configured to move the plurality of brushes to a wafer cleaning position adjacent to the first surface of the wafer and to a brush cleaning position adjacent to the brush cleaner by rotating the at least one of the plurality of brushes around the first axis.

* * * * *